(12) United States Patent
Uebel et al.

(10) Patent No.: US 11,262,665 B2
(45) Date of Patent: Mar. 1, 2022

(54) FREQUENCY BROADENING APPARATUS AND METHOD

(71) Applicant: ASML Netherlands B.V., Veldhoven (NL)

(72) Inventors: Patrick Sebastian Uebel, Marloffstein (DE); Sebastian Thomas Bauerschmidt, Wendelstein (DE); Paul William Scholtes-Van Eijk, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/827,843

(22) Filed: Mar. 24, 2020

(65) Prior Publication Data

US 2020/0310251 A1    Oct. 1, 2020

(30) Foreign Application Priority Data

Mar. 25, 2019 (EP) .................................... 19164997
Nov. 7, 2019 (EP) .................................... 19207621

(51) Int. Cl.
*G03F 9/00* (2006.01)
*G03F 7/20* (2006.01)
(Continued)

(52) U.S. Cl.
CPC ....... *G03F 9/7065* (2013.01); *G02B 6/02328* (2013.01); *G02F 1/365* (2013.01);
(Continued)

(58) Field of Classification Search
CPC ... G02B 6/02328; G02F 1/3528; G02F 1/365; G03F 7/70133; G03F 7/7015;
(Continued)

(56) References Cited

U.S. PATENT DOCUMENTS 6,020,964 A   2/2000  Loopstra et al.
6,952,253 B2  10/2005 Lof et al.
(Continued)

FOREIGN PATENT DOCUMENTS

EP    1628164 A2     2/2006
TW    2016-10542 A   3/2016
(Continued)

OTHER PUBLICATIONS

International Search Report and Written Opinion of the International Searching Authority directed to related International Patent Application No. PCT/EP2020/055288, dated May 29, 2020; 9 pages.

(Continued)

*Primary Examiner* — Michelle M Iacoletti
(74) *Attorney, Agent, or Firm* — Sterne, Kessler, Goldstein & Fox P.L.L.C.

(57) ABSTRACT

An apparatus (100) for receiving input radiation (108) and broadening a frequency range of the input radiation so as to provide broadband output radiation (110). The apparatus comprises a fiber (102), wherein the fiber (102) may comprise a hollow core (104) for guiding radiation propagating through the fiber (102). The apparatus (100) further comprises an apparatus for providing a gas mixture (106) within the hollow core (104). The gas mixture (106) comprises a hydrogen component, and a working component, wherein the working component is for broadening a frequency range of a received input radiation (108) so as to provide the broadband output radiation (110). The apparatus may be included in a radiation source.

20 Claims, 9 Drawing Sheets

(51) Int. Cl.
*G02B 6/02* (2006.01)
*G02F 1/365* (2006.01)

(52) U.S. Cl.
CPC ........ *G03F 7/7015* (2013.01); *G03F 7/70133* (2013.01); *G03F 7/70316* (2013.01); *G03F 7/70325* (2013.01); *G03F 7/70575* (2013.01); *G03F 7/70616* (2013.01)

(58) Field of Classification Search
CPC ............ G03F 7/70316; G03F 7/70325; G03F 7/70575; G03F 7/70616; G03F 9/7065
See application file for complete search history.

(56) References Cited

U.S. PATENT DOCUMENTS

| | | | |
|---|---|---|---|
| 6,961,116 | B2 | 11/2005 | Den Boef et al. |
| 7,265,364 | B2 | 9/2007 | Teunissen et al. |
| 7,646,471 | B2 | 1/2010 | Teunissen et al. |
| 7,701,577 | B2 | 4/2010 | Straaijer et al. |
| 7,791,724 | B2 | 9/2010 | Den Boef et al. |
| 8,115,926 | B2 | 2/2012 | Straaijer |
| 8,145,023 | B2 | 3/2012 | Thomsen |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 10,670,978 | B2 | 6/2020 | Leung et al. |
| 2007/0058173 | A1 | 3/2007 | Holzapfel |
| 2009/0195768 | A1 | 8/2009 | Bijnen et al. |
| 2010/0233600 | A1 | 9/2010 | Den Boef et al. |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0249244 | A1 | 10/2011 | Leewis et al. |
| 2012/0044470 | A1 | 2/2012 | Smilde et al. |
| 2012/0082410 | A1 | 4/2012 | Peng et al. |
| 2013/0162996 | A1 | 6/2013 | Straaijer et al. |
| 2015/0261097 | A1 | 9/2015 | Mathijssen et al. |
| 2016/0161863 | A1 | 6/2016 | Den Boef et al. |
| 2016/0370717 | A1 | 12/2016 | Den Boef et al. |
| 2017/0351023 | A1 | 12/2017 | Alkeskjold et al. |
| 2018/0180875 | A1* | 6/2018 | Dalrymple ........... G02B 26/103 |

FOREIGN PATENT DOCUMENTS

| | | |
|---|---|---|
| WO | WO 2006/021569 A1 | 3/2006 |
| WO | WO 2008/083686 A1 | 7/2008 |
| WO | WO 2011/012624 A1 | 2/2011 |
| WO | WO 2016/102127 A1 | 6/2016 |

OTHER PUBLICATIONS

Karlitschek, P. et al., "Influence of hydrogen on the colour center formation in optical fibers induced by pulsed UV-laser radiation. Part 1: all silica fibers with high-OH undoped core", *Optics Communications*, 155 (1998); pp. 376-385.

Russell, P. St. J. et al., "Hollow-core photonic crystal fibres for gas-based nonlinear optics", *Nature Photonics*, vol. 8 (Apr. 2014); pp. 278-286.

Hosseini, P. et al., "Enhanced Control of Transient Raman Scattering Using Buffered Hydrogen in Hollow-Core Photonic Crystal Fibers", *Physical Review Letters*, 119, 253903 (2017); 5 pages.

Benabid, F. et al., "Stimulated Raman Scattering in Hydrogen-Filled Hollow-Core Photonic Crystal Fiber", *Science*, vol. 298 (2002); pp. 399-402.

Ermolov, A. et al., "Supercontinuum generation in the vacuum ultraviolet through dispersive-wave and soliton-plasma interaction in a noble-gas-filled hollow-core photonic crystal fiber", *Physical Review A*, 92, 033821 (2015); 7 pages.

Hosseini, P. et al., "UV soliton dynamics and Raman-enhanced super-continuum generation in photonic crystal fiber", *Max Planck Institute for the Science of Light* (2018); 5 pages.

Belli, F. et al., "Vacuum-ultraviolet to infrared supercontinuum in hydrogen-filled photonic crystal fiber" *Optica*, vol. 2, No. 4 (Apr. 2015); pp. 292-300.

* cited by examiner

FREQUENCY BROADENING APPARATUS AND METHOD

FIELD

The present invention relates to methods and apparatus for broadening a frequency range of input radiation to provide broadband output radiation. In particular, the invention may relate to apparatus and associated methods that use hollow core optical fibers with a gas mixture disposed within the hollow core to achieve such frequency broadening.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In the field of lithography, many measurement systems may be used, both within a lithographic apparatus and external to a lithographic apparatus. Generally, such a measurements system may use a radiation source to irradiate a target with radiation, and a detection system operable to measure at least one property of a portion of the incident radiation that scatters from the target. An example of a measurement system that is external to a lithographic apparatus is an inspection apparatus or a metrology apparatus, which may be used to determine properties of a pattern previously projected onto a substrate by the lithographic apparatus. An inspection apparatus may detect defects or imperfections on a substrate. A metrology apparatus may return data relating to one or more properties of a substrate, wherein the data may be quantitative data. An external inspection or metrology apparatus may, for example, comprise a scatterometer. Examples of measurement systems that may be provided within a lithographic apparatus include: a topography measurement system (also known as a level sensor); a position measurement system (for example an interferometric device) for determining position of a reticle or wafer stage; and an alignment sensor for determining a position of an alignment mark. These measurement devices may use electromagnetic radiation to perform the measurement.

The quality of the measurements by a metrology tool may affect the extent to which the performance of a lithographic apparatus can be determined and improved. It is therefore desirable to have a detailed understanding of deposited patterns on a substrate.

Different types of radiation may be used to interrogate different types of properties of a pattern.

SUMMARY

According to a first aspect of the invention there is provided an apparatus for receiving input radiation and broadening a frequency range of the input radiation so as to provide broadband output radiation, the apparatus comprising: a fiber, the fiber comprising a hollow core for guiding radiation propagating through the fiber; and an apparatus for providing a gas mixture within the hollow core. The gas mixture may comprise a hydrogen component, and a working component for broadening a frequency range of a received input radiation so as to provide the broadband output radiation.

According to another aspect of the invention there is provided an apparatus for receiving input radiation and broadening a frequency range of the input radiation so as to provide broadband output radiation, the apparatus comprising: a fiber, the fiber comprising a hollow core for guiding radiation propagating through the fiber; and a gas mixture disposed within the hollow core. The gas mixture may comprise a hydrogen component, and a working component for broadening a frequency range of a received input radiation so as to provide the broadband output radiation.

The apparatus according to the first aspect of the invention can be used as part of a radiation source for providing broadband radiation by providing a gas mixture within the hollow core of the fibre.

It will be appreciated that the working component being for broadening the frequency range of the received input radiation so as to provide the broadband output radiation may mean that the spectral broadening that is achieved is predominantly dependent on the working component. It will be further appreciated that this may mean that the hydrogen component has a negligible effect on the spectrum of the broadband output radiation. This spectral broadening may for example be through non-linear effects as radiation interacts with the working gas.

In order to achieve frequency broadening high intensity radiation may be required. An advantage of having a hollow core design in the fibre is that it may achieve high intensity radiation through strong spatial confinement of radiation propagating through the fiber, achieving high localised radiation intensities. In addition, hollow core designs (for example as compared to solid core designs) can result in higher quality transmission modes (for example, having a greater proportion of single mode transmission).

The radiation intensity inside the fiber may be high, for example due to high received input radiation intensity and/or due to strong spatial confinement of the radiation inside fiber An advantage of using a hollow core fiber is that the majority of the radiation guided inside the fiber is confined to the hollow core of the fiber. Therefore, the majority of the interaction of the radiation inside the fiber is with the gas mixture, which is provided inside the hollow core of the fiber. As a result, the broadening effects of the working component on the radiation may be increased.

The inventors have realized that, as a result of the high intensity radiation inside the fiber, the fiber may experience degradation, which may reduce its lifetime. This is surprising given that in hollow core fibers the majority of the radiation is confined to the hollow core, and therefore there is little spatial overlap between the material (for example glass) from which the fiber is formed and radiation that propagates through the fiber. For example, as little as 0.5% of less of the radiation power may spatially overlap with the material of the fiber. Further, the inventors have realized that an advantage of the gas mixture having a hydrogen component is that the presence of the hydrogen component reduces radiation-induced degradation of the fiber. As a result, the performance of the fiber is maintained at a higher level for a longer radiation exposure duration, increasing the lifetime of the fiber.

The received input radiation may be electromagnetic radiation. The radiation may be received as pulsed radiation. For example, the radiation may comprise ultrafast pulses. The mechanism for the spectral broadening as the radiation interacts with the working gas may be soliton formation or soliton fission.

The radiation may be coherent radiation. The radiation may be collimated radiation, and advantage of which may be to facilitate and improve the efficiency of coupling the radiation into the fiber. The radiation may comprise a single frequency, or a narrow range of frequency. The input radiation may be generated by a laser.

Optionally, the broadband output radiation of the apparatus may comprise a continuous range of radiation frequencies.

The broadband range may be a continuous range. The output radiation may comprise supercontinuum radiation. Continuous radiation may be beneficial for use in a number of applications, for example in metrology applications. The continuous range of frequencies may be used to interrogate a large number of properties. The continuous range of frequencies may for example be used to determine and/or eliminate a frequency dependency of a measured property.

The supercontinuum output radiation may comprise for example electromagnetic radiation over a wavelength range of 300 nm-2000 nm. The broadband output radiation frequency range may be for example 400 nm-900 nm, or 500 nm-900 nm. The supercontinuum output radiation may comprise white light.

Optionally, wherein the hydrogen component of the gas mixture may comprise at least one of hydrogen gas, deuterium gas, and tritium gas. Optionally, the hydrogen component may comprise hydrogen radicals.

The hydrogen component may comprise any isotope of hydrogen. In one embodiment, the hydrogen component consists of hydrogen gas ($H_2$).

Optionally, the working component of the gas mixture may comprise a noble gas.

The noble gas may comprise at least one of Argon, Krypton, Neon, Helium and Xenon. Alternatively or additionally to the noble gas, the working component may comprise a molecular gas (e.g. $N_2$, $O_2$, $Cl_4$, $SF_6$).

In order to ensure that the spectral broadening of the radiation to achieve broadband output radiation is predominantly performed by the working component, the fraction of hydrogen component in the gas mixture may be less than a threshold amount.

Optionally, the fraction of the hydrogen component in the gas mixture may be less than 70%.

The fraction of the hydrogen component may be large enough so that the apparatus has an increased resistance against deterioration by the received input radiation. Simultaneously, the fraction of the hydrogen component may be kept small enough to allow a greater fraction of the working component, so that the broadening effect of the working component on the radiation may be improved. The hydrogen component may also provide a broadening effect on radiation interacting with the gas mixture.

The fraction of the hydrogen component and the fraction of the working component may make up substantially the entire gas mixture. Alternatively, the gas mixture may comprise one or more other components. The fraction of the one or more other components in the gas mixture may be negligible.

Optionally, the fraction of the hydrogen component in the gas mixture may be less than 50%. Optionally, the fraction of the hydrogen component in the gas mixture is less than 10%. Optionally, the fraction of the hydrogen component in the gas mixture may be less than 2%.

Optionally, the fiber may be a photonic crystal fiber.

Optionally, the fiber may comprise a ring structure surrounding the hollow core.

A fiber may comprise a ring structure surrounding the hollow core. The ring structure may be located substantially in the centre of the fiber cross-section. The ring structure may define the hollow core. The hollow core may be formed by a central portion of the ring structure. A hollow core fiber comprising a ring structure may be advantageous in that it has excellent confinement properties compared to some other photonic crystal fibers.

A ring structure may comprise a hollow cladding portion of the fiber. The outer boundary of the hollow cladding portion may be may be supported by an internal surface of a support sleeve. The hollow cladding portion may be substantially constant in shape along an elongate dimension of the fiber. The hollow cladding portion may for example be substantially cylindrical in shape, so that in a cross-section perpendicular to the elongate dimension of the fiber the shape of the hollow cladding portion is substantially annular, forming a ring.

A central portion of the hollow cladding portion may form or define the hollow core of the fiber. The diameter of the hollow core inside the ring structure may be between 15 and 85 μm. The diameter of the hollow core may affect the mode field parameter, impact loss, dispersion, modal plurality, and non-linearity properties of the hollow core fiber.

Optionally, the ring structure may comprise a plurality of structures arranged around a central portion of the ring structure.

The plurality of structures arranged around a central portion of the ring structure may be referred to as a ring of structures. The central portion remaining hollow may define the hollow core. The arrangement of the structures may define the size and shape of the hollow core of the fiber.

Optionally, the plurality of structures may comprise one or more anti-resonant elements. Optionally the plurality of structures may comprise a plurality of capillaries.

The structures arranged around the central portion of the ring structure may be capillaries, which may also be referred to as tubes. The capillaries may surround the hollow core. The capillaries may be circular in shape, or may have another shape. The capillaries may comprise a wall surrounding a hollow capillary core. The capillary wall may have a wall thickness between 0.1-1.0 μm.

The ring of structures may be a ring of anti-resonant elements, wherein the anti-resonant elements may be capillaries.

Optionally, the plurality of structures may be arranged so that the structures do not touch any of the other structures.

The structures may be arranged in such a way that they do not touch each other. A structure may be in physical contact with the internal surface of a support sleeve of the fiber.

Optionally, the fiber may comprise a plurality of ring structures, wherein at least one of the plurality of ring structures surrounds the hollow core.

Optionally, at least one of the ring structures may comprise a plurality of structures arranged around a central portion of the ring structure.

The fiber may comprise a plurality of ring structures, which may be referred to as a multi-ring structure. At least one of the plurality of ring structures may have properties corresponding to the ring structure described above. In some instances each of the plurality of ring structures defines a hollow core. One or more of the ring structures may comprise one or more anti-resonant elements, which may for example be capillaries. The plurality of ring structures may cooperate to further improve the guiding and confinement properties of the fiber compared to a ring structure. However, fabrication of a multi-ring structure may be more difficult than fabrication of a single ring structure.

A fiber may comprise other structures outside of one or more ring structures.

Optionally, the hydrogen component of the gas mixture may increase the lifetime of the plurality of structures.

The amount of increase in lifetime may depend on the amount of radiation power introduced into the fiber. The amount of increase in lifetime may also depend on the properties of the plurality of structures, for example the wall thickness.

Optionally, the degradation of the performance after 1000 hours of operation does not exceed 2%.

The increase in lifetime resulting from the hydrogen component of the gas mixture may lead to a reduction in the degradation of the performance of the apparatus. The hydrogen component, and the fraction of the hydrogen component in the gas mixture, may be chosen so that after 1000 hours of operation, the degradation of the performance of the apparatus does not exceed 20%, 10%, 5%, or 2%.

The apparatus may further comprise a radical generating apparatus for forming radicals from the gas mixture.

According to another aspect of the invention there is provided an apparatus for receiving input radiation and broadening a frequency range of the input radiation so as to provide broadband output radiation, the apparatus comprising: a chamber; a fiber, the fiber comprising a hollow core for guiding radiation propagating through the fiber, the hollow core of the fiber being in fluid communication with the chamber; a gas generating apparatus for providing a gas within the chamber; and a radical generating apparatus for providing radicals within the chamber.

The apparatus according to this aspect of the invention can be used as part of a radiation source for providing broadband radiation by providing a gas within the hollow core of the fibre. Since the hollow core of the fiber is in fluid communication with the gas chamber, the gas and radicals provided within the chamber will also be present in the hollow core of the fiber. Advantageously, the radicals may react with contaminants, breaking these contaminants down into smaller molecules that are more easily removed. This can result in less damage to the fiber and an increased lifetime of the apparatus.

The chamber may also be referred to as a gas chamber or a gas cell.

It will be appreciated one way for the hollow core of the fiber to be in fluid communication with the gas chamber may be for the fiber to be disposed wholly within the gas chamber. Alternatively, one end of the fiber may be disposed within the gas chamber and at least a second end of the fiber may extend out of the gas chamber. In such embodiments, the at least a second end of the fiber may extend out of the gas chamber via a seal and it will be appreciated that the second end may be similarly in fluid communication with a second gas chamber.

The radical generating apparatus may comprise: a supply of molecular gas; and an energy deposition mechanism operable to supply energy to the supply of gas so as to cause the gas molecules to dissociate and form free radicals. The supply of molecular gas may, for example, be provided by the gas generating apparatus or from another, separate source.

According to another aspect of the invention there is provided a radiation source for providing broadband output radiation, the radiation source comprising the apparatus as described above, and an input radiation source configured to provide input radiation to the apparatus. The apparatus may be configured to broaden the input radiation to provide the broadband output radiation.

Optionally, the input radiation may be pulsed.

Optionally, the broadband output radiation may have an average power of at least 1 W.

Optionally, the broadband output radiation may have an average power of at least 5 W.

A radiation source according to claim 22, wherein the broadband output radiation has an average power of at least 10 W.

The broadband output radiation may have a power spectral density in the entire wavelength band of the output radiation of at least 0.1 mW/nm. The power spectral density in the entire wavelength band of the output radiation may be at least 1 mW/nm. The power spectral density in the entire wavelength band of the output radiation may be at least 3 mW/nm.

Optionally, the fraction of the hydrogen component in the gas mixture of the apparatus may be sufficiently high so that the fiber has an average output power stability of at least 95% for more than 100 hours of operation.

According to another aspect of the invention there is provided a method of broadening a radiation frequency range. The method may comprise providing an apparatus as described above, and propagating input radiation through the hollow core fiber, wherein the interaction of the input radiation with the gas inside the hollow core fiber causes broadening of the frequency range of the input radiation so as to produce broadband output radiation.

According to another aspect of the invention there is provided a metrology arrangement for determining a parameter of interest of a structure on a substrate. The metrology arrangement may comprise a radiation source as described above, an illumination sub-system for illuminating the structure on the substrate using the broadband output radiation, and a detection sub-system for detecting a portion of radiation scattered and/or reflected by the structure, and for determining the parameter of interest from said portion of radiation.

According to another aspect of the invention there is provided a metrology apparatus comprising a metrology arrangement as described above.

According to another aspect of the invention there is provided an inspection apparatus comprising a metrology arrangement as described above.

According to another aspect of the invention there is provided a lithographic apparatus comprising a metrology arrangement as described above.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
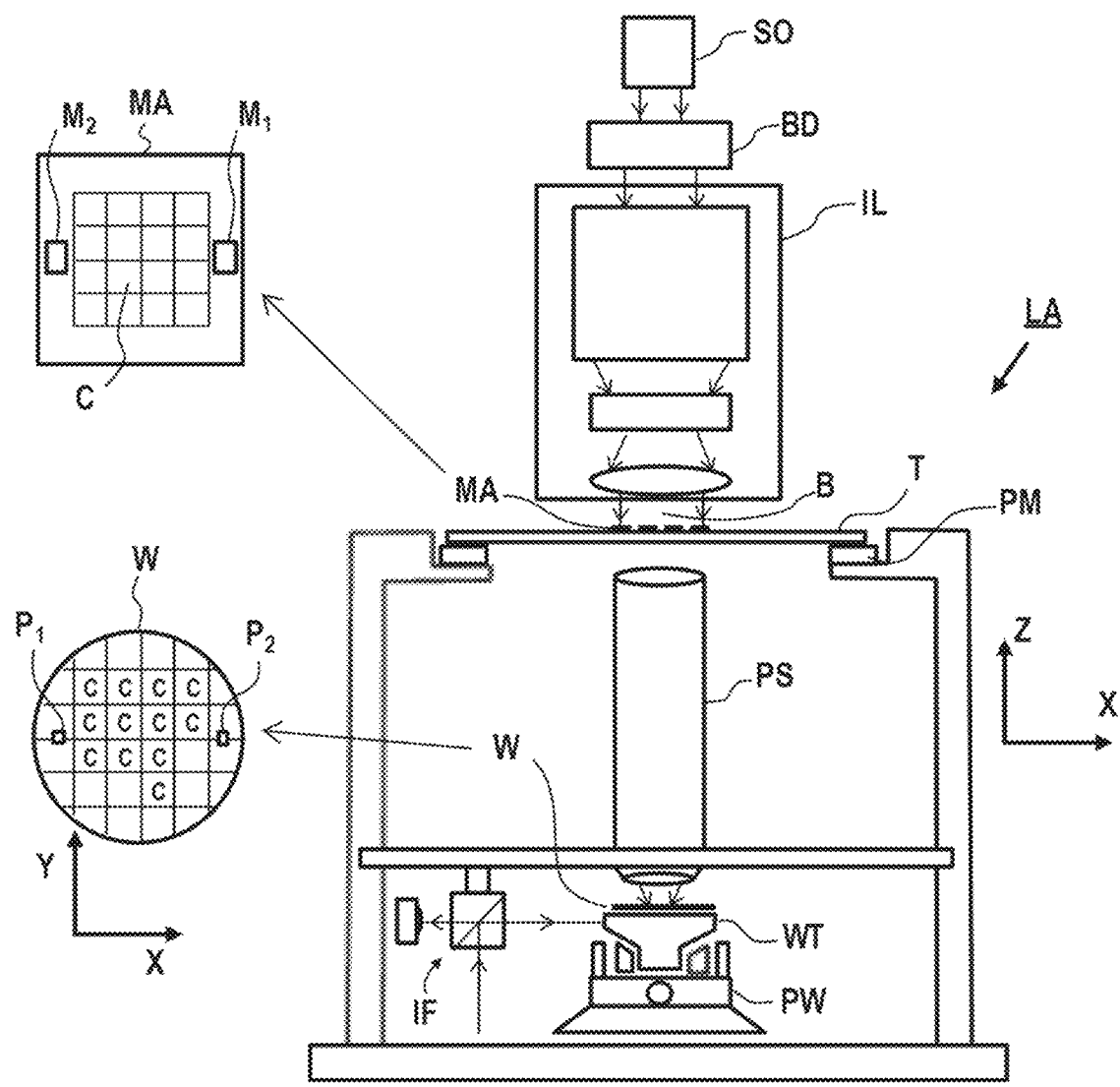
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) T constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO. e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support T, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
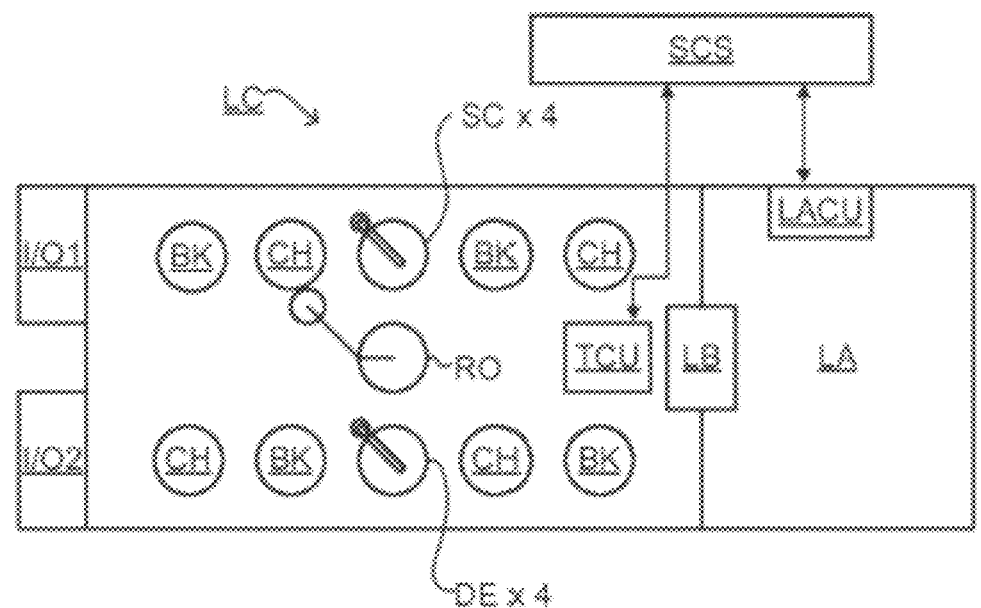
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA. e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
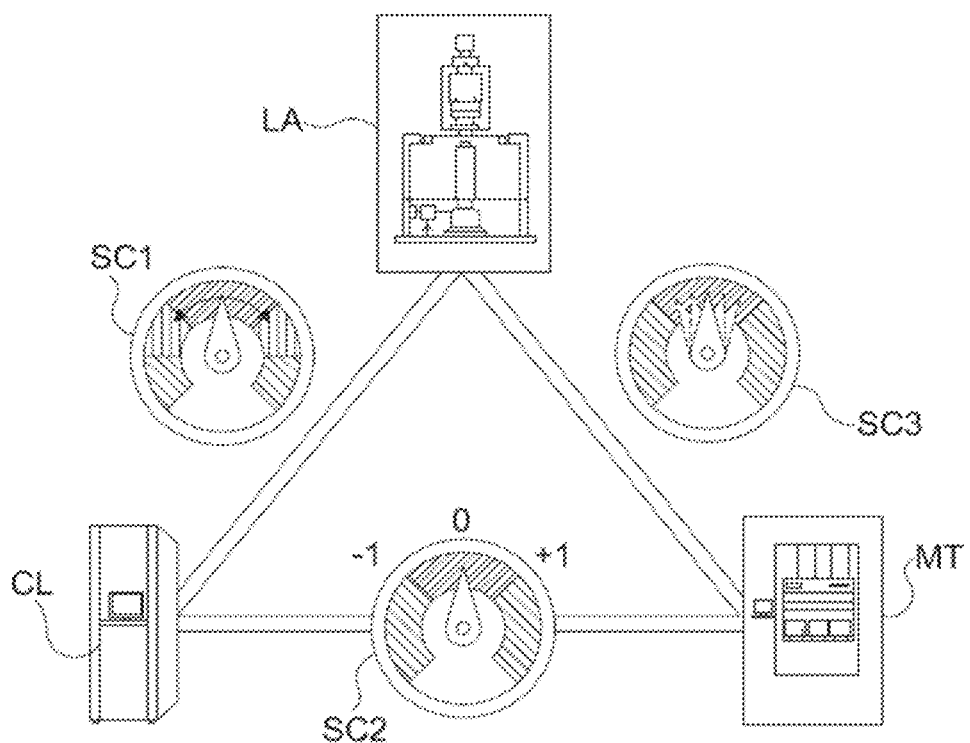
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3). Different types of metrology tools MT for measuring one or more properties relating to a lithographic apparatus and/or a substrate to be patterned will now be described.

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is a ellipsometric scatterometer. The ellipsometric scatterometer allows for determining parameters of a lithographic process by measuring scattered radiation for each polarization state. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Figure 4:
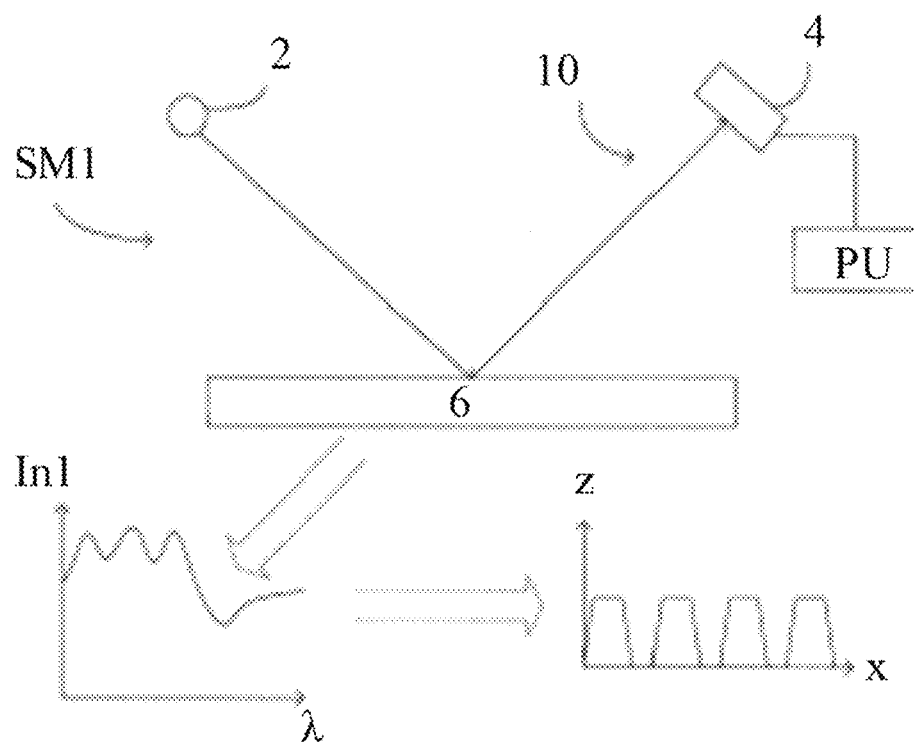
FIG. 4 depicts a schematic overview of a scatterometer metrology tool.

A metrology apparatus, such as a scatterometer SM1, is depicted in FIG. 4. It comprises a broadband (white light) radiation projector 2 which projects radiation onto a substrate 6. The reflected or scattered radiation is passed to a spectrometer detector 4, which measures a spectrum 10 (i.e. a measurement of intensity In1 as a function of wavelength λ) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 4. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1. US20120044470A, US20110249244, US20110026032 or EP1,628,164A, incorporated herein by reference in their entirety. Aforementioned scatterometers can measure in one image multiple targets from multiple gratings using light from soft x-ray and visible to near-IR wave range.

A topography measurement system{XE "topography measurement system"}, level sensor{XE "level sensor"} or height{XE "height"} sensor{XE "height sensor"}, and which may be integrated in the lithographic apparatus, is arranged to measure a topography of a top surface of a substrate{XE "substrate"} (or wafer{XE "wafer"}). A map of the topography of the substrate, also referred to as height map{XE "height map" }, may be generated from these measurements indicating a height of the substrate as a function of the position on the substrate. This height map may subsequently be used to correct the position of the substrate during transfer of the pattern on the substrate, in order to provide an aerial image{XE "aerial image"} of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 5:
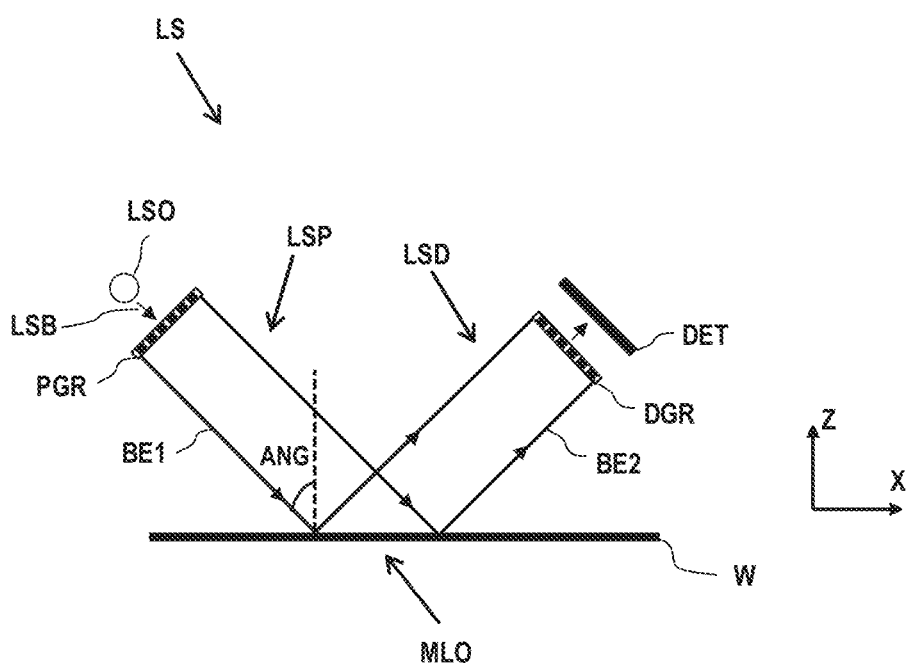
FIG. 5 depicts a schematic overview of a level sensor metrology tool.

An example of a level or height{XE "height"} sensor{XE "height sensor"} LS as known in the art is schematically shown in FIG. 5, which illustrates only the principles of operation. In this example, the level sensor{XE "level sensor"} comprises an optical system, which includes a projection unit{XE "projection unit"} LSP and a detection unit{XE "detection unit"} LSD. The projection unit LSP comprises a radiation source{XE "radiation source"} LSO providing a beam of radiation LSB which is imparted by a projection grating{XE "projection grating"} PGR of the projection unit LSP. The radiation source LSO may be, for example, a narrowband or broadband radiation source, such as a supercontinuum light source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation, but may additionally or alternatively encompass UV and/or IR radiation and any range of wavelengths suitable to reflect from a surface of a substrate{XE "substrate"}.

The projection grating{XE "projection grating"} PGR is a periodic grating comprising a periodic structure resulting in a beam of radiation BE having a periodically varying intensity. The beam of radiation BE1 with the periodically varying intensity is directed towards a measurement location MLO on a substrate{XE "substrate"} W having an angle of incidence ANG with respect to an axis perpendicular (Z-axis) to the incident substrate surface between 0 degrees and 90 degrees, typically between 70 degrees and 80 degrees. At the measurement location MLO, the patterned beam of radiation BE1 is reflected by the substrate W (indicated by arrows BE2) and directed towards the detection unit{XE "detection unit"} LSD.

In order to determine the height{XE "height"} level at the measurement location MLO, the level sensor{XE "level sensor"} further comprises a detection system comprising a detection grating{XE "detection grating"} DGR, a detector DET and a processing unit (not shown) for processing an output signal of the detector DET. The detection grating DGR may be identical to the projection grating{XE "projection grating"} PGR. The detector DET produces a detector output signal indicative of the light received, for example indicative of the intensity of the light received, such as a photodetector, or representative of a spatial distribution of the intensity received, such as a camera. The detector DET may comprise any combination of one or more detector types.

By means of triangulation techniques, the height{XE "height"} level at the measurement location MLO can be determined. The detected height level is typically related to the signal strength as measured by the detector DET, the signal strength having a periodicity that depends, amongst others, on the design of the projection grating{XE "projection grating"} PGR and the (oblique) angle of incidence ANG.

The projection unit{XE "projection unit"} LSP and/or the detection unit{XE "detection unit"} LSD may include further optical elements, such as lenses and/or mirrors, along the path of the patterned beam of radiation between the projection grating{XE "projection grating"} PGR and the detection grating{XE "detection grating"} DGR (not shown).

In an embodiment, the detection grating{XE "detection grating"} DGR may be omitted, and the detector DET may be placed at the position where the detection grating DGR is located. Such a configuration provides a more direct detection of the image of the projection grating{XE "projection grating"} PGR.

In order to cover the surface of the substrate{XE "substrate"} W effectively, a level sensor{XE "level sensor"} LS may be configured to project an array of measurement beams BE1 onto the surface of the substrate W, thereby generating an array of measurement areas MLO or spots covering a larger measurement range.

Various height{XE "height"} sensors of a general type are disclosed for example in U.S. Pat. Nos. 7,265,364 and 7,646,471, both incorporated by reference. A height sensor{XE "height sensor"} using UV radiation instead of visible or infrared radiation is disclosed in US2010233600A1, incorporated by reference. In WO2016102127A1, incorporated by reference, a compact height sensor is described which uses a multi-element detector to detect and recognize the position of a grating image, without needing a detection grating{XE "detection grating"}.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor, a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example. U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

In the manufacture of complex devices, typically many lithographic patterning steps are performed, thereby forming functional features in successive layers on the substrate{XE "substrate"}. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks. Each mark{XE "mark"} is a structure whose position can be measured at a later time using a position sensor{XE "position sensor"}, typically an optical position sensor. The position sensor may be referred to as "alignment sensor{XE "alignment sensor"}" and marks may be referred to as "alignment marks{XE "alignment mark"}". A mark may also be referred to as a metrology target.

A lithographic apparatus may include one or more (e.g. a plurality of) alignment sensors by which positions of alignment marks{XE "alignment mark"} provided on a substrate{XE "substrate"} can be measured accurately. Alignment (or position) sensors may use optical phenomena such as diffraction and interference to obtain position information from alignment marks{XE "alignment mark"} formed on the substrate. An example of an alignment sensor{XE "alignment sensor"} used in current lithographic apparatus is based on a self-referencing interferometer as described in U.S. Pat. No. 6,961,116. Various enhancements and modifications of the position sensor{XE "position sensor"} have been developed, for example as disclosed in US2015261097A1. The contents of all of these publications are incorporated herein by reference.

A mark{XE "mark"}, or alignment mark, may comprise a series of bars formed on or in a layer provided on the substrate{XE "substrate"} or formed (directly) in the substrate. The bars may be regularly spaced and act as grating{XE "grating"} lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor{XE "alignment sensor"} scans each mark{XE "mark"} optically with a spot of radiation to obtain a periodically varying signal, such as a sine wave. The phase of this signal is analyzed, to determine the position of the mark and, hence, of the substrate{XE "substrate"} relative to the alignment sensor, which, in turn, is fixated relative to a reference frame{XE "reference frame"} of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

Measuring the position of the marks may also provide information on a deformation of the substrate{XE "substrate"} on which the marks are provided, for example in the form of a wafer grid{XE "wafer grid"}. Deformation of the substrate may occur by, for example, electrostatic clamping of the substrate to the substrate table and/or heating of the substrate when the substrate is exposed to radiation.

Figure 6:
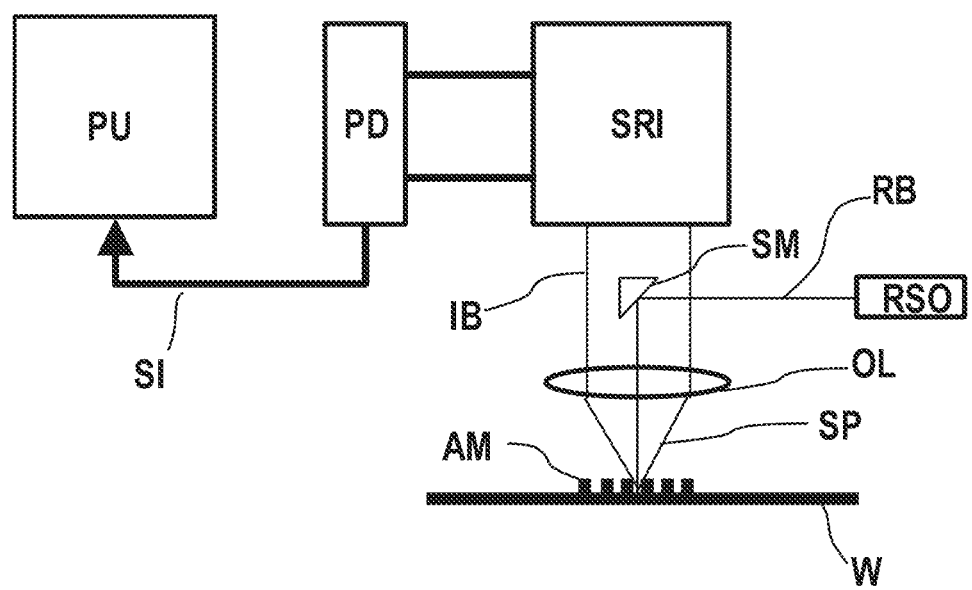
FIG. 6 depicts a schematic overview of an alignment sensor metrology tool.

FIG. 6 is a schematic block diagram of an embodiment of a known alignment sensor{XE "alignment sensor"} AS, such as is described, for example, in U.S. Pat. No. 6,961,116, and which is incorporated by reference. Radiation source RSO provides a beam RB of radiation of one or more wavelengths, which is diverted by diverting optics onto a mark{XE "mark"}, such as mark AM located on substrate{XE "substrate"} W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark{XE "mark"} AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark{XE "mark"}, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate{XE "substrate"} relative to a reference frame{XE "reference frame"} are output.

A single measurement of the type illustrated only fixes the position of the mark{XE "mark"} within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor{XE "alignment sensor"} and spot SP remain stationary, while it is the substrate{XE "substrate"} W that moves. The alignment sensor can thus be mounted rigidly and accurately to a reference frame{XE "reference frame"}, while effectively scanning the mark{XE "mark"} AM in a direction opposite to the direction of movement of substrate W. The substrate W is controlled in this movement by its mounting on a substrate support and a substrate positioning system controlling the movement of the substrate support. A substrate support position sensor{XE "position sensor"} (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks{XE "alignment mark"} provided on the substrate allows the position of the substrate relative to the substrate support to be determined.

Metrology tools MT, such as a scatterometer, topography measurement system, or position measurement system mentioned above may use radiation originating from a radiation source to perform a measurement. The properties of the radiation used by a metrology tool may affect the type and quality of measurements that may be performed. For some applications, it may be advantageous to use multiple radiation frequencies to measure a substrate, for example broadband radiation may be used. Multiple different frequencies may be able to propagate, irradiate, and scatter off a metrology target with no or minimal interference with other frequencies. Therefore different frequencies may for example be used to obtain more metrology data simultaneously. Different radiation frequencies may also be able to interrogate and discover different properties of a metrology target. Broadband radiation may be useful in metrology systems MT such as for example level sensors, alignment mark measurement systems, scatterometry tools, or inspection tools. A broadband radiation source may be a supercontinuum source.

High quality broadband radiation, for example supercontinuum radiation, may be difficult to generate. One method for generating broadband radiation may be to broaden high-power narrow band or single frequency input radiation, for example making use of non-linear, higher order effects. The input radiation (which may be produced using a laser) may be referred to as pump radiation. To obtain high power radiation for broadening effects, radiation may be confined into a small area so that strongly localised high intensity radiation is achieved. In those areas, the radiation may interact with broadening structures and/or materials forming a non-linear medium so as to create broadband output radiation. In the high intensity radiation areas, different materials and/or structures may be used to enable and/or improve radiation broadening by providing a suitable non-linear medium. As high-intensity radiation areas are achieved, these areas may experience significant strain, and may be damaged as a result of the radiation. Specifically, as the radiation interacts with materials and/or structures, part of the radiation may be absorbed or scattered, in which case energy may be transferred to the fiber. For areas with high intensity radiation, the resulting energy may cause damage to the materials and/or structures. The resulting energy may cause structural changes in areas of high radiation intensity, for example a deformation of the shape and/or position of a structure. Damage and/or deformation of the materials and/or structures within the fiber and may in turn decrease the efficiency of the broadening effects.

As described herein, methods and apparatus for broadening input radiation are presented using a fiber for confining input radiation, and for broadening input radiation to output broadband radiation. The fiber may be a hollow core fiber, and may comprise internal structures to achieve effective guiding and confinement of radiation in the fiber. The fiber may be a hollow core photonic crystal fiber (HC-PCF), which is particularly suitable for strong radiation confinement, predominantly inside the hollow core of the fiber, achieving high radiation intensities. The hollow core of the fiber may be filled with a gas mixture acting as a broadening medium for broadening input radiation. Such a fiber and gas mixture arrangement may be used to create a supercontinuum radiation source. Radiation input to the fiber may be electromagnetic radiation, for example radiation in one or more of the infrared, visible, UV, and extreme UV spectra. The output radiation may consist of or comprise broadband radiation, which may be referred to herein as white light.

Figure 7:
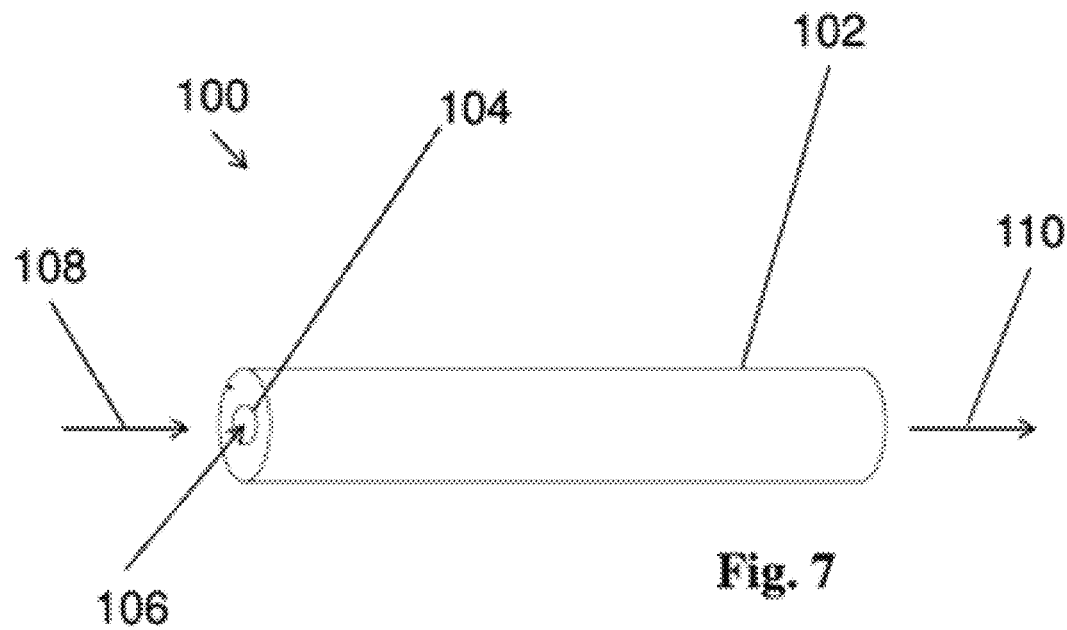
FIG. 7 depicts an apparatus for broadening the frequency range of received input radiation.

FIG. 7 depicts an apparatus 100 for receiving input radiation 108 and broadening a frequency range of the input radiation 108 so as to provide broadband output radiation 110. The apparatus 100 comprises a fiber 102 with a hollow core 104 for guiding radiation propagating through the fiber 102. The apparatus 100 comprises a gas mixture 106 disposed within the hollow core 104. The gas mixture 106 comprises at least a hydrogen component and a working component. The working component may enable the broadening of the frequency range of the received input radiation 108 so as to provide broadband output radiation 110. The fiber 102 may be a single mode fiber. The fiber 102 may have any length and it will be appreciated that the length of the fiber 102 may be dependent on the application (for example the amount of spectral broadening that is desired to achieve with the apparatus 100). The fiber 102 may have a length between 1 cm and 10 m, for example, the fiber 102 may have a length between 10 cm and 100 cm.

In one implementation, the gas mixture 106 may be disposed within the hollow core at least during receiving of input radiation 108 for producing broadband output radiation 110. It will be appreciated that, while the apparatus 100 is not receiving input radiation 108 for producing broadband output radiation, the gas mixture 106 may be wholly or partially absent from the hollow core. In general, the apparatus 100 comprises an apparatus for providing the gas mixture 106 within the hollow core 104 of the fiber 102. Such apparatus for providing the gas mixture 106 within the hollow core 104 of the fiber 102 may comprise a reservoir, as now discussed with reference to FIG. 8.

Figure 8:
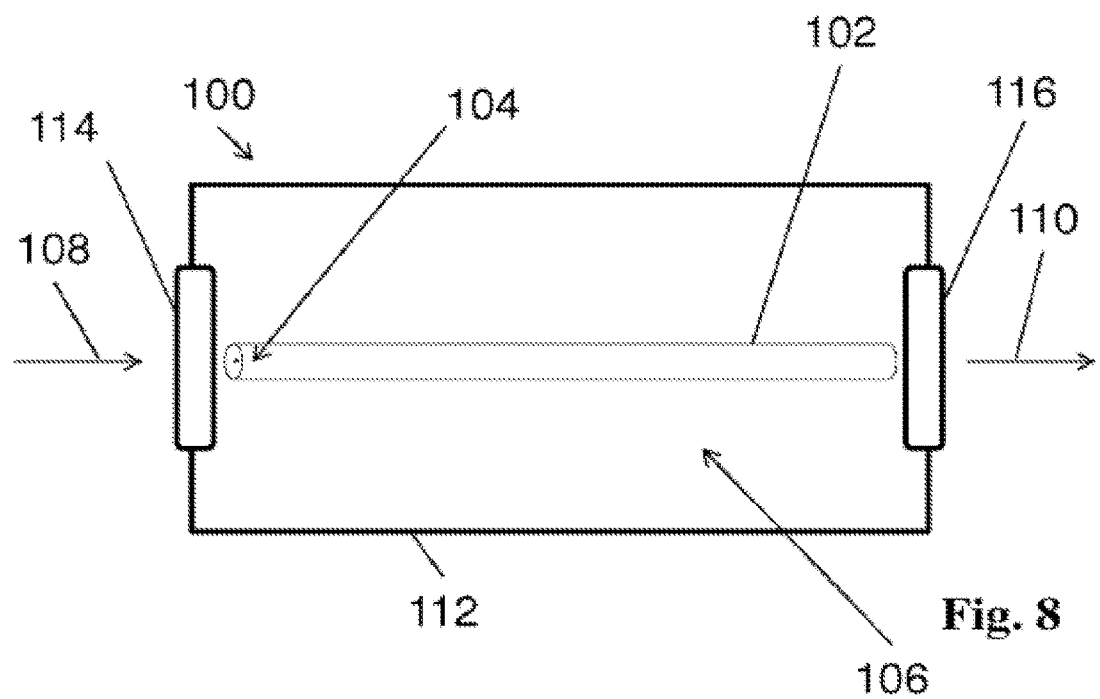
FIG. 8 depicts an apparatus for broadening the frequency range of received input radiation of the type shown in FIG. 7, further comprising a reservoir.

FIG. 8 depicts an apparatus 100, wherein a fiber 102 with a hollow core 104 is placed inside a reservoir 112. The reservoir 112 may also be referred to as a housing or container. The reservoir 112 is configured to contain gas mixture 106. The reservoir 112 may comprise one or more features, known in the art, for controlling, regulating, and/or monitoring the composition of the gas mixture 106 inside the reservoir 112. By controlling the composition of the gas mixture 106 inside the reservoir 112 under suitable pressure, the gas mixture 106 can be provided within the hollow core 104 of the fiber 102. The reservoir may comprise a first transparent window 114. In use, the fiber is placed inside the reservoir 112 such that the first transparent window 114 is located proximate to an input end of fiber 102. The first transparent window 114 may form part of a wall of the reservoir 112. The first transparent window 114 may be transparent for at least the received input radiation frequencies, so that received input radiation 108 (or at least a large portion thereof) may be coupled into fiber 102 located inside reservoir 112. The reservoir 112 may comprise a second transparent window 116, forming part of a wall of the reservoir 112. In use, when the fiber is placed inside the reservoir 112, the second transparent window 116 is located proximate to an output end of the fiber 102. The second transparent window 116 may be transparent for at least the frequencies of the broadband output radiation 110 of the apparatus 100.

Alternatively, the two opposed ends of the fiber 102 may be placed inside different reservoirs. The fiber 102 may comprise a first end section configured to receive input radiation 108, and a second end section for outputting broadband output radiation 110. The first end section may be placed inside a first reservoir, comprising a gas mixture 106. The second end section may be placed inside a second reservoir, wherein the second reservoir may also comprise a gas mixture 106. The functioning of the reservoirs may be as described in relation to FIG. 8 above. The first reservoir may comprise a first transparent window 114, configured to be transparent for input radiation 108. The second reservoir may comprise a second transparent window 116 configured to be transparent for broadband output broadband radiation 110. The first and second reservoirs may also comprise a sealable opening to permit the fiber 102 to be placed partially inside and partially outside the reservoir, so that the gas mixture is sealed inside the reservoir. The fiber 102 may further comprise a middle section not contained inside a reservoir. Such an arrangement using two separate gas reservoirs may be particularly convenient for embodiments wherein the length of the fiber 102 is relatively long (for example when the length is more than 1 m). It will be appreciated that for such arrangements which use two separate gas reservoirs, the two reservoirs (which may comprise one or more features, known in the art, for controlling, regulating, and/or monitoring the composition of the gas mixture inside the two reservoirs) may be considered to provide an apparatus for providing the gas mixture 106 within the hollow core 104 of the fiber 102.

In this context a window may be transparent for a frequency if at least 50%, 75%, 85%, 90%, 95%, or 99% of incident radiation of that frequency on the window is transmitted through the window.

Both the first 114 and the second 116 transparent windows may form an airtight seal within the walls of the reservoir 112 so that the gas mixture 106 may be contained within the reservoir 112. It will be appreciated that the gas mixture 106 may be contained within the reservoir 112 at a pressure different to the ambient pressure of the reservoir 112.

The apparatus 100 may be used as part of a radiation source for providing broadband radiation by providing a gas mixture within the hollow core of the fibre. It will be appreciated that the working component being for broadening the frequency range of the received input radiation 108 so as to provide the broadband output radiation 110 may mean that the spectral broadening that is achieved is predominantly dependent on the working component. It will be further appreciated that this may mean that the hydrogen component has a negligible effect on the spectrum of the broadband output radiation 110. This spectral broadening may for example be through non-linear effects as radiation interacts with the working gas 106.

In order to achieve frequency broadening high intensity radiation may be required. An advantage of having a hollow core fibre 102 is that it may achieve high intensity radiation through strong spatial confinement of radiation propagating through the fiber 102, achieving high localised radiation intensities. In addition, hollow core designs (for example as compared to solid core designs) can result in higher quality transmission modes (for example, having a greater proportion of single mode transmission). The radiation intensity inside the fiber 102 may be high, for example due to high received input radiation intensity and/or due to strong spatial confinement of the radiation inside fiber 102. Hollow core fibers 102 may guide radiation in transverse modes, wherein the overlap of the hollow transverse modes with the fiber material is very low. This may result in a high damage threshold compared to solid core fibers.

An advantage of using a hollow core fiber may be that the majority of the radiation guided inside the fiber 102 is confined to the hollow core 104 of the fiber 102. Therefore, the majority of the interaction of the radiation inside the fiber is with the gas mixture 106, which is provided inside the hollow core 104 of the fiber 102. As a result, the broadening effects of the working component on the radiation may be increased.

The inventors have realized that, as a result of the high intensity radiation inside the fiber 102, the fiber 102 may experience degradation, which may reduce its lifetime. This is surprising given that in hollow core fibers the majority of the radiation is confined to the hollow core 104, and therefore there is little spatial overlap between the material (for example glass) from which the fiber 102 is formed and radiation that propagates through the fiber 102. The amount of overlap of radiation with the material of the fiber 102 may depend on the design of the hollow core fiber 102, as well as the wavelength of the radiation. However, at least in some embodiments less than 0.5% of the input radiation power in the hollow core fiber 102 overlaps with the material of the fiber 102. In one example, wherein the fiber 102 comprises a 7-capillary single ring design having capillary wall thickness of 190 nm, less than 0.1% of the input radiation power in the hollow core fiber 102 overlaps with the material of the fiber 102. Further, the inventors have realized that an advantage of the gas mixture having a hydrogen component is that the presence of the hydrogen component reduces radiation-induced degradation of the fiber 102. As a result, the performance of the fiber is maintained at a higher level for a longer radiation exposure duration, increasing the lifetime of the fiber 102.

The received input radiation 108 may be electromagnetic radiation. The input radiation 108 may be received as pulsed radiation. For example, the input radiation 108 may comprise ultrafast pulses. The mechanism for the spectral broadening as the radiation interacts with the working gas may be for example one or more of four-wave mixing, modulation instability, ionisation of the working gas, Raman effects, Kerr nonlinearity, soliton formation, or soliton fission. In particular, the spectral broadening may be achieved through one or both of soliton formation, or soliton fission.

The input radiation 108 may be coherent radiation. The input radiation 108 may be collimated radiation, and advantage of which may be to facilitate and improve the efficiency of coupling the input radiation 108 into the fiber 102. The input radiation 108 may comprise a single frequency, or a narrow range of frequency. The input radiation 108 may be generated by a laser. Similarly, the output radiation 110 may be collimated and/or coherent.

As described herein a fiber 102 may be an optical fiber. A fiber 102 may have an elongate body, longer in one dimension compared to the other two dimensions of the fiber 102. Running along the center of the elongate dimension of the fiber 102 is a fiber axis. A cross-section of the fiber 102 perpendicular to the axis may be referred to as a transverse cross-section. The transverse cross-section may be substantially constant along the fiber axis. The hollow core 104 of the fiber may extend along the elongate dimension of the fiber. The hollow core 104 may be located substantially in a central region of the fiber 102, so that the axis of the fiber 102 may also act as an axis of the hollow core 104 of the fiber 102. The fiber 102 may be formed from any material, for example glass material. For example, a fiber 102 may consist of or comprise any of the following: high purity silica ($SiO_2$) (for example the F300 material as marketed by Heraeus Holding GmbH of Germany); soft glasses such as for example lead-silicate glass (for example the SF6 glass marketed by Schott AG of Germany); or other specialty glasses such as for example chalcogenide glass or heavy metal fluoride glasses (also referred to as ZBLAN glasses).

The broadband range of the output radiation 110 may be a continuous range, comprising a continuous range of radiation frequencies. The output radiation 110 may comprise supercontinuum radiation. Continuous radiation may be beneficial for use in a number of applications, for example in metrology applications. For example, the continuous range of frequencies may be used to interrogate a large number of properties. The continuous range of frequencies may for example be used to determine and/or eliminate a frequency dependency of a measured property. Supercontinuum output radiation 110 may comprise for example electromagnetic radiation over a wavelength range of 100 nm-4000 nm. The broadband output radiation 110 frequency range may be for example 400 nm-900 nm, 500 nm-900 nm, or 200 nm-2000 nm. The supercontinuum output radiation 110 may comprise white light.

The hydrogen component of the gas mixture 106 may comprise at least one of hydrogen gas ($H_2$), deuterium gas, and tritium gas. The hydrogen component may comprise any isotope of hydrogen. In one embodiment, the hydrogen component consists of hydrogen gas ($H_2$).

The working component of the gas mixture 106 may be a noble gas. The working component may comprise one or more of Argon, Krypton, Neon, Helium, and Xenon. Alternatively or additionally to the noble gas, the working component may comprise a molecular gas (e.g. $N_2$, $O_2$, $CH_4$, $SF_6$).

In order to ensure that the spectral broadening of the radiation to achieve broadband output radiation 110 is predominantly performed by the working component, the fraction of the hydrogen component in the gas mixture may be less than a threshold amount. The fraction of the hydrogen component in the gas may be less than 70%. The fraction of the hydrogen component in the gas may be less than 50%. The fraction of the hydrogen component in the gas may be less than 10%. The fraction of the hydrogen component in the gas may be less than 2%. Unless stated to the contrary, as used herein when a fraction of a component of a gas is expressed as a fraction or percentage of the gas, this is intended to mean a fraction or percentage of the gas by volume. The fraction of the hydrogen component may be large enough so that the apparatus 100 has an increased resistance against deterioration by the received input radiation 108. Simultaneously, the fraction of the hydrogen component may be kept small enough to allow a greater fraction of the working component, so that the broadening effect of the working component on the radiation may be improved. It will be appreciated that the hydrogen component may also provide a broadening effect on radiation interacting with the gas mixture. The fraction of the hydrogen component may be kept small enough that any such broadening effect on the radiation from the hydrogen is significantly smaller that the broadening effect of the working component on the radiation. The fraction of the hydrogen component and the fraction of the working gas component may make up substantially the entire gas mixture, that is to say, the fractions of the hydrogen component and the working component may add up to substantially 100%, while not exceeding 100%.

The fiber 102 of the apparatus 100 may be a photonic crystal fiber. A hollow core photonic crystal fiber (HC-PCF) may confine radiation predominantly inside a hollow core 104. The radiation may be confined in the form of transverse modes, propagating along the fiber axis. A cladding may surround the hollow core 104 of the fiber 102, wherein the cladding may comprise thin-walled elements (which may be referred to as capillaries). The material of the elements may be the same as the material of the bulk material of the fiber 102. The HC-PCF may comprise a plurality of hollow channels, surrounding the hollow core 104. A gas may fill one or more of the hollow channels of the HC-PCF.

The fiber 102 may comprise a ring structure of hollow capillaries surrounding the hollow core 104. The ring structure may extend along the elongate dimension of the fiber 102, surrounding the axis of the fiber 102. The ring structure may be located substantially in the centre of the fiber cross-section. The ring structure may at least partially define the hollow core 104. For example, at least part of the hollow core 104 may be formed by a central portion of the ring structure. A hollow core fiber comprising a ring structure may be advantageous in that it has excellent confinement properties compared to some other photonic crystal fibers. If a fiber comprises only one ring structure, the ring structure may be referred to as a single ring structure.

FIG. 9 depicts three different example ring structures 122, 123, 124 within a fiber 102. A central portion of the ring structures 122, 123, 124 may at least partially form or define the hollow core 104 of the fiber 102. The ring structure 122, 123, 124 may comprise one or more structures 118 (for example hollow capillaries) within the ring structure 122, 123, 124. The ring structure 122, 123, 124 may form a hollow cladding portion of the fiber. The one or more structures 118 form part of the cladding portion of the fiber 102. The hollow core 104 is formed by a central portion within the ring structure where no structures are present. An outer boundary of the hollow cladding portion may be supported by an internal surface of a support sleeve 126. The hollow cladding portion may be substantially constant in shape along an elongate dimension of the fiber. The hollow cladding portion may for example be substantially cylindrical in shape, so that in a cross-section perpendicular to the elongate dimension of the fiber 102, the shape of the hollow cladding portion is substantially annular, forming a ring. A central portion of the hollow cladding portion may form, or define, the hollow core 104 of the fiber 102. As described herein, the hollow core 104 does not comprise any structures. Structures surrounding the hollow core 104 form part of the cladding of the fiber 102. The diameter of the hollow core 104 inside the ring structure may be between 10 and 100 µm. The mode field parameter, impact loss, dispersion, modal plurality, and non-linearity properties of the hollow core fiber 102 may be dependent on the diameter of the hollow core 104.

The ring structure 122, 123, 124 may comprise a plurality of structures 118 arranged around a central portion of the ring structure 122, 123, 124. The plurality of structures 118 may be located within the ring structure 122, 123, 124. The ring structure may be hollow except for the plurality of structures 118 located within the ring structure 122, 123, 124. As illustrated in FIG. 9, the plurality of structures 118 may be disposed around a central portion of the ring and the central portion of the ring structure may remain hollow. The plurality of structures 118 arranged around the central portion of the ring structure may be referred to as a ring of structures. The central portion remaining hollow may define the hollow core 104. The arrangement of the structures 118 may define the size and shape of the hollow core 104 of the fiber 102. Different arrangements of the plurality of structures 118 may be used to obtain different radiation guiding and confinement properties.

The plurality of structures 118 may comprise one or more anti-resonant elements. In one example, each of the structures 118 may be an anti-resonant element. Such a fiber comprising anti-resonant structures are known in the art as anti-resonant fibers, negative curvature fibers or inhibited coupling fibers. Various different designs of such fibers are known in the art. Each of the plurality of structures 118 may comprise a capillary. The structures 118 arranged around a central portion of the ring structure 122, 123, 124 may comprise capillaries. The capillaries may surround the hollow core 104. In cross section, the capillaries may be substantially circular in shape, or may have another shape. The capillaries may comprise a wall surrounding a hollow capillary core. The capillary wall thickness may be between 0.1 µm and 1.0 µm. In one example the plurality of structures 118 may comprise a ring of anti-resonant elements, wherein the anti-resonant elements may be capillaries. The plurality of structures may comprise for example 4, 5, 6, 7, 8, 9, or 10 capillaries. In one example a fiber may comprise a single ring structure with six capillaries 118.

Figures 9A, 9B, 9C:
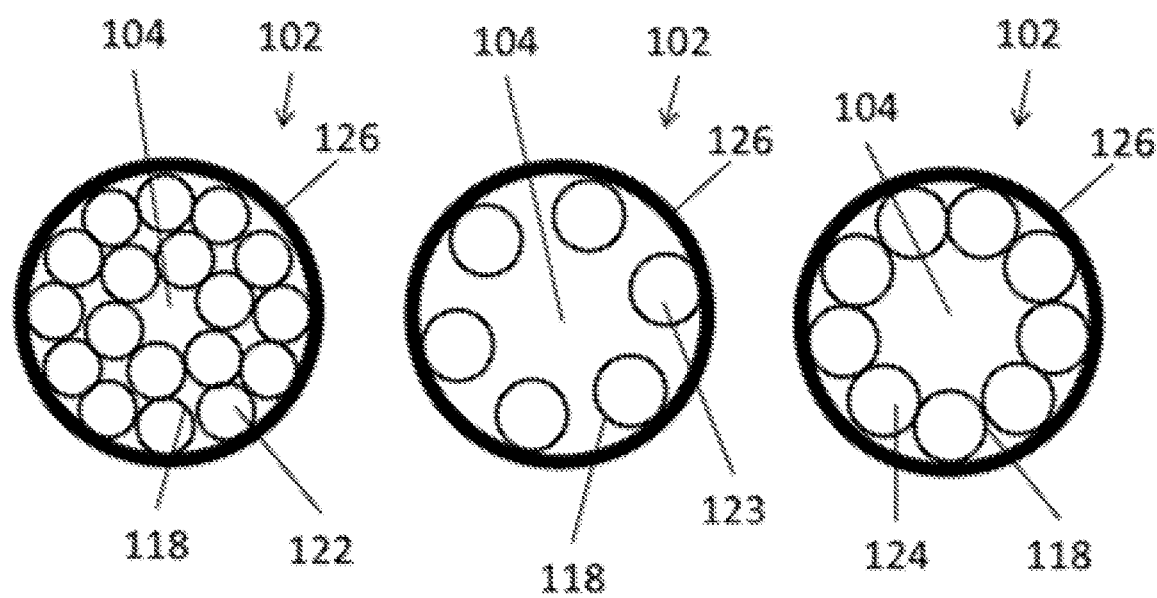
FIGS. 9(a), 9(b) and 9(c) depict arrangements of a plurality of structures arranged around a central portion of a single ring structure.

As illustrated in FIG. 9, the plurality of structures 118 may be placed within the ring structure 122, 123, 124 in different arrangements. FIG. 9(a) depicts a plurality of anti-resonant capillaries 118 forming multiple rings of structures around a hollow core 104. Some of the capillaries 118 (in particular an outer ring of the capillaries) contact, and are directly supported by, the support sleeve 126 of the fiber 102. Some of the capillaries 118 (in particular inner rings of capillaries)

are not in direct contact with the support sleeve 126, and instead contact, and are supported by, at least one other structure 118. As illustrated in FIG. 9(b), the plurality of structures 118, which may be capillaries, may be arranged within a ring structure 123 so that none the structures 118 touches any of the other of the plurality of structures 118. The plurality of structures 118 may be separated from each other but contact and are supported by the support sleeve 126 of the fiber 102. In another example arrangement illustrated in FIG. 9(c) each of the structures 118 may touch at least one other of the plurality of structures 118, as well as the support sleeve 126 of the fiber 102. In general, an arrangement within the ring structure may be a combination of what is described above, wherein each of the plurality of structures 118 contacts at last one other structure, that is to say it is not free-standing within the ring structure. The contacting structure may be another structure 118 or the support sleeve 126 of the fiber 102.

In some embodiments, the fiber 102 may comprise a plurality of ring structures, wherein one of the plurality of ring structures surrounds the hollow core 104 of the fiber 102. The fiber 102 may comprise multiple cores for guiding and confining radiation around one or more cores. In a first example, a plurality of ring structures may be used for providing a single core 104 for guiding and confining radiation. One of the plurality of ring structures (in particular an innermost ring structure) may define the hollow core for guiding and confining radiation, and the other, outer ring structures may provide supporting structures for the one ring structure. At least one of the cores is a hollow core 104. In a third example, the fiber 102 may comprise multiple ring structures defining a hollow core 104 for guiding and confining radiation, as well as ring structures for supporting the ring structures confining and guiding radiation. One or more of the ring structures may comprise a solid core (although it will be appreciated that the fiber will in general comprise at least one hollow core 104 filled with the gas mixture 106). A plurality of ring structures comprised within a single fiber 102 may be referred to as a multi-ring structure.

At least one of the ring structures may comprise a plurality of structures 118 arranged around a central portion of the ring structure for forming or defining the hollow core 104. At least one of the plurality of ring structures may have properties corresponding to the ring structure described as a single ring structure above. In some instances, each of the plurality of ring structures defines a hollow core 104. One or more of the ring structures may comprise one or more anti-resonant elements, which may for example be capillaries. The walls of the capillaries may have a suitable thickness so as to act as an anti-resonant element. The plurality of ring structures may cooperate to further improve the guiding and confinement properties of the fiber 102 compared to using a single ring structure (that is they may reduce losses in the fiber 102). However, the fabrication of a multi-ring structure may be more demanding and/or stringent than fabrication a fiber 102 comprising a single ring structure 122. A fiber 102 may comprise one or more structures that are not ring structures.

The gas mixture 106 of the apparatus 100 comprises a hydrogen component. The gas mixture 106 may be disposed inside the hollow spaces inside the one or more ring structures. These hollow spaces comprise the hollow core, and may further comprise one or more hollow spaces in and/or around the structures 118, for example the hollow centre of a capillary 118 and/or spaces between capillaries 118. The hydrogen component of the gas mixture 106 may increase the lifetime of the plurality of structures 118. The amount of increase in lifetime may depend on the amount of radiation power introduced into the fiber 102. The amount of increase in lifetime may also depend on the properties of the plurality of structures 118, for example the wall thickness of the structures 118. The hydrogen component may increase the lifetime of the structures 118 for example by improving the mechanical stability of the thin walls of the structures 118 under irradiation. The increase in lifetime may be such that the degradation of performance of the apparatus after 1000 hours of operation does not exceed 20, 10%, 5%, or 2%. In one example, degradation of the performance of the apparatus 100 did not exceed 2% after 1000 hours of operation with an average input power of approximately 20 W.

The structure inside a hollow core fiber 102 may be chosen so that the majority of radiation may be confined and guided within the hollow core 104 of the fiber 102. For example, a single ring structure 122 comprising a plurality of anti-resonant elements 118 around a hollow core 104 may result in strong radiation confinement inside the hollow core 104. Another advantage of this configuration may be the improved efficiency due to strong confinement. Radiation may be confined inside the hollow core 104 as one or more transverse modes. Radiation confined within the hollow core 104 may interact with the gas mixture 106 inside the hollow core 104. Radiation inside the hollow core 104 may avoid interacting with the material from which the fiber 102 is formed. An advantage of strong confinement within a hollow core 104 may be that the interaction between the gas mixture 106, including the working component, and the radiation is increased, which may result in improved broadening of the radiation.

Under long exposure to high intensity radiation, for example more than 1 hour, more than 2 hours, or more than 5 hours, the performance of a hollow core fiber 102 with a plurality of anti-resonant elements 118 inside a ring structure was found to deteriorate. It is known that fiber materials may be damaged by high intensity radiation, for example because the large amount of energy provided by the radiation may break bonds inside the material. However, with the majority of the radiation confined within the hollow core 104 and avoiding interaction with the fiber material, it is surprising that the deterioration of performance was found. Upon further investigation, it was found that the thin-walled structures 118 suffered mechanical damage as a result of exposure to high intensity radiation, even with strong confinement of the radiation inside the hollow core 104. Adding a hydrogen component to the gas mixture may result in preventing the mechanical decay of the structure and may improve the mechanical resilience of the structures 118 inside the ring structure. This may be because the hydrogen component may react with the (glass) material of the thin-walled structures 118, making the material more chemically stable, and less susceptible to radiation damage (for example less susceptible to formation of defects such as colour centre).

Figure 10:
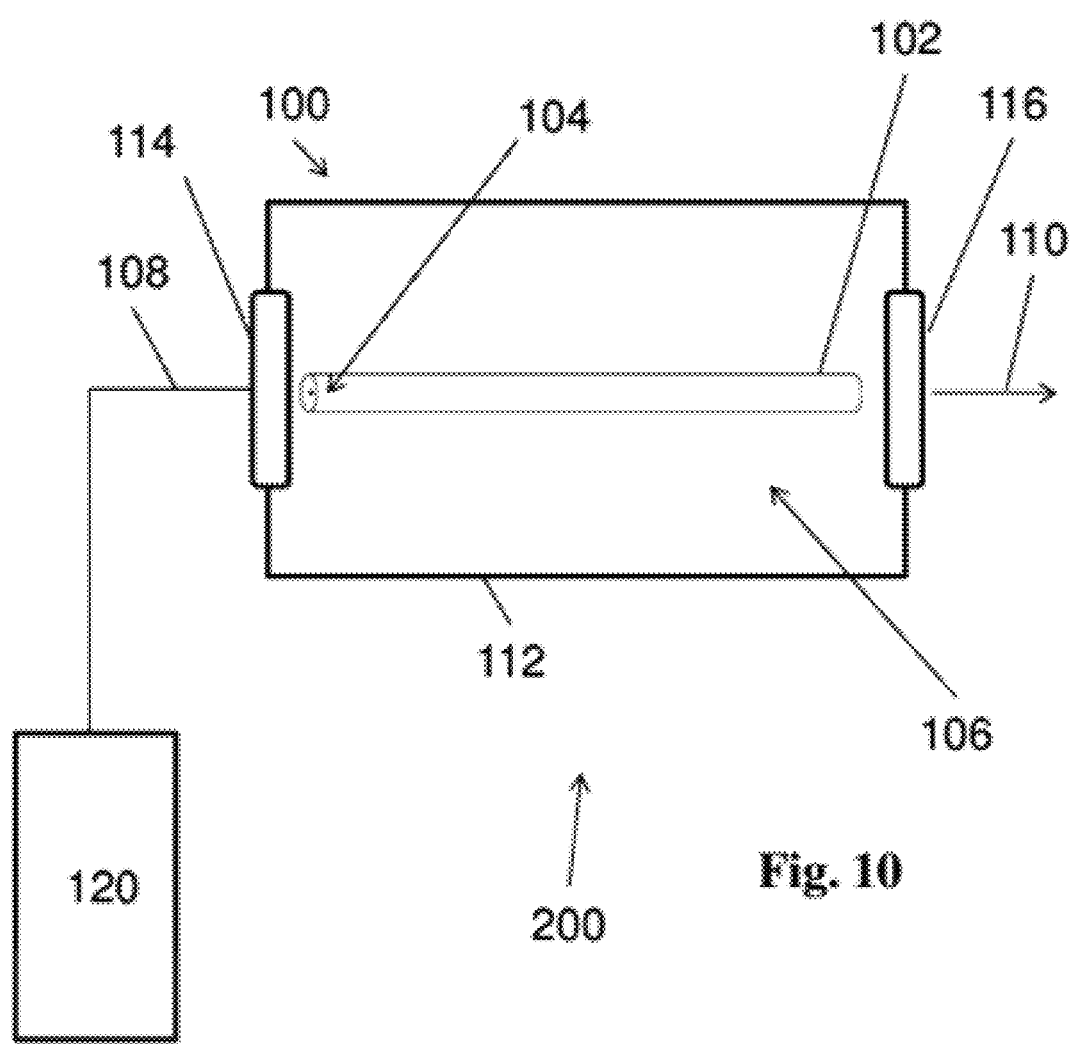
FIG. 10 depicts a schematic representation of a radiation source for providing broadband output radiation.

FIG. 10 depicts a radiation source 200 for providing broadband output radiation. The radiation source comprises an apparatus 100 as described above. The radiation source further comprises an input radiation source 120 configured to provide input radiation 108 to the apparatus 100. The apparatus may receive input radiation 108 from the input radiation source 120, and broaden it to provide output radiation 110.

The input radiation 108 provided by the radiation source 120 may be pulsed. The input radiation 108 may comprise electromagnetic radiation of one or more frequencies between 200 nm and 2 m. The input radiation may for example comprise electromagnetic radiation with a wavelength of 1.03 µm. The repetition rate of the pulsed radiation may be of an order of magnitude of 1 kHz to 10 MHz. The pulse energies may have an order of magnitude of 0.1 µJ to 100 µJ, for example 5-10 µJ. A pulse duration for the input radiation 108 may be between 10 fs and 10 ps, for example 300 fs. The average power of input radiation 108 may be between 100 mW to several 100 W. The average power of input radiation 108 may for example be 20-50 W.

The broadband output radiation 110 provided by the radiation source 200 may have an average output power of at least 1 W. The average output power may be at least 5 W. The average output power may be at least 10 W. The broadband output radiation 110 may be pulsed broadband output radiation 110. The broadband output radiation 110 may have a power spectral density in the entire wavelength band of the output radiation of at least 0.1 mW/nm. The power spectral density in the entire wavelength band of the broadband output radiation may be at least 3 mW/nm.

The fraction of the hydrogen component in the gas mixture 106 of the apparatus 100 of the radiation source 200 may be sufficiently high so that the fiber 102 has an average output power stability of at least 95% for more than 100 hours of operation.

Figure 11:
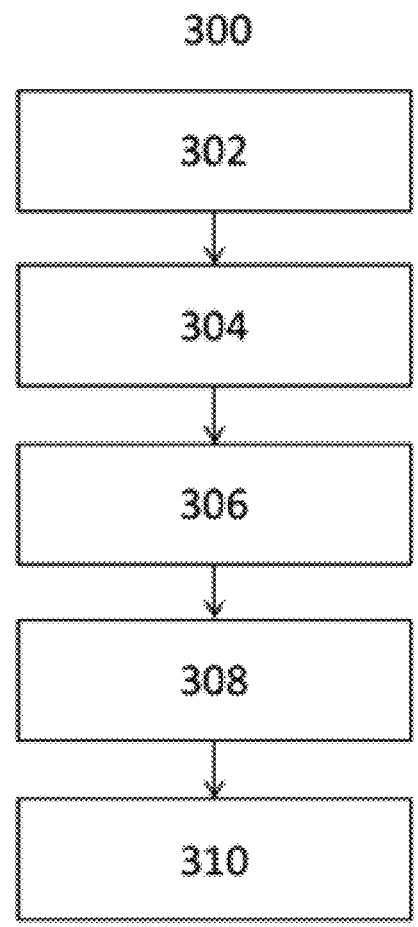
FIG. 11 depicts a flow diagram of steps in a method of broadening a radiation frequency.

FIG. 11 depicts a flow diagram of a method 300 of broadening a radiation frequency range. The method comprises providing 302 an apparatus 100 as described above. In step 304 input radiation is propagated through the hollow core fiber 102 of the apparatus 100. During the propagation through the hollow core fiber, the input radiation 108 interacts 306 with gas mixture 106 inside the hollow core fiber 104. The interaction of the input radiation 108 and the working component of the gas mixture 106 causes broadening 308 of the frequency range of the input radiation to produce 310 broadband output radiation 110.

Figure 12:
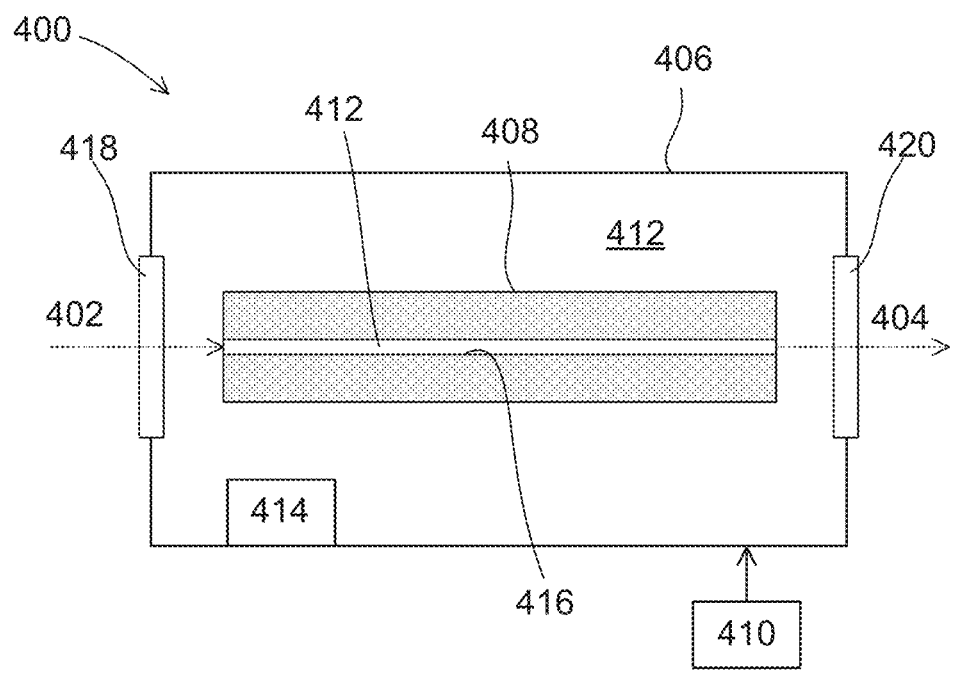
FIG. 12 depicts an apparatus for broadening the frequency range of received input radiation according to an embodiment.

FIG. 12 shows schematically a general set up for an apparatus 400 for receiving input radiation 402 and broadening a frequency range of the input radiation 402 so as to provide broadband output radiation 404.

The apparatus 400 comprises a gas chamber 406, an optical fiber 408 disposed inside the gas chamber 406, a gas generating apparatus 410 for providing a gas 412 within the gas chamber 406 and a radical generating apparatus 414 for forming radicals from a gas within the gas chamber 406

The gas chamber 406 may also be referred to as a housing or container. The gas chamber 406 is configured to contain gas 412. The gas chamber 406 may comprise one or more features, known in the art, for controlling, regulating, and/or monitoring the composition of the gas 412 inside the gas chamber 406.

The optical fiber 408 comprises a hollow core 416 for guiding radiation propagating through the optical fiber 408. It will be appreciated that in order to aid the clarity of the Figure the hollow core 416 of the optical fiber 408 is shown in FIG. 12 rather schematically and that cladding and support portions surrounding the hollow core 416 are not shown in any detail. The optical fiber 408 may be of the form of any hollow-core photonic crystal fiber. For example, in some embodiments, the optical fiber 408 may be generally of the form of the optical fibers 102 described above with reference to FIGS. 7 to 10.

The gas generating apparatus 410 is configured to provide a gas 412 within the gas chamber 406 and, therefore, to provide at least a portion of the gas 412 within the hollow core 416. The gas 412 comprises a working component, which enables the broadening of the frequency range of the received input radiation 402 so as to provide broadband output radiation 404.

The gas chamber 406 may comprise a first transparent window 418. In use, the optical fiber 408 is disposed inside the gas chamber 406 such that the first transparent window 418 is located proximate to an input end of the optical fiber 408. The first transparent window 418 may form part of a wall of the gas chamber 406. The first transparent window 418 may be transparent for at least the received input radiation frequencies, so that received input radiation 402 (or at least a large portion thereof) may be coupled into the optical fiber 408 located inside gas chamber 406. The gas chamber 406 may comprise a second transparent window 420, forming part of a wall of the gas chamber 406. In use, when the optical fiber 408 is disposed inside the gas chamber 406, the second transparent window 420 is located proximate to an output end of the optical fiber 408. The second transparent window 420 may be transparent for at least the frequencies of the broadband output radiation 404 of the apparatus 400.

Alternatively, in another embodiment, the two opposed ends of the optical fiber 408 may be placed inside different gas chambers. The optical fiber 408 may comprise a first end section configured to receive input radiation 402, and a second end section for outputting broadband output radiation 404. The first end section may be placed inside a first chamber, comprising a gas 412. The second end section may be placed inside a second chamber, wherein the second chamber may also comprise a gas 412. The functioning of the chambers may be as described in relation to FIG. 12 above. The first chamber may comprise a first transparent window, configured to be transparent for input radiation 402. The second chamber may comprise a second transparent window configured to be transparent for broadband output broadband radiation 404. The first and second chambers may also comprise a sealable opening to permit the optical fiber 408 to be placed partially inside and partially outside the chamber, so that the gas is sealed inside the chamber. The optical fiber 408 may further comprise a middle section not contained inside a chamber. Such an arrangement using two separate gas chambers may be particularly convenient for embodiments wherein the optical fiber 408 is relatively long (for example when the length is more than 1 m). It will be appreciated that for such arrangements which use two separate gas chambers, the two chambers (which may comprise one or more features, known in the art, for controlling, regulating, and/or monitoring the composition of the gas 412 inside the two chambers) may be considered to provide an apparatus for providing the gas 412 within the hollow core 416 of the optical fiber 408.

In general, the optical fiber 408 may be disposed such that the hollow core 412 is in fluid communication with at least one gas chamber generally of the form of gas chamber 406.

In this context a window may be transparent for a frequency if at least 50%, 75%, 85%, 90%, 95%, or 99% of incident radiation of that frequency on the window is transmitted through the window.

Both the first 418 and the second 420 transparent windows may form an airtight seal within the walls of the gas chamber 406 so that the gas 412 may be contained within the gas chamber 406. It will be appreciated that the gas 412 may be contained within the gas chamber 406 at a pressure different to the ambient pressure of the gas chamber 406.

The working component of the gas 412 may be a noble gas. The working component may comprise one or more of Argon, Krypton, Neon, Helium and Xenon. Alternatively or additionally to the noble gas, the working component may comprise a molecular gas (e.g. $N_2$, $O_2$, $CH_4$, $SF_6$).

In order to achieve frequency broadening high intensity radiation may be desirable. An advantage of having a hollow core optical fibre 408 is that it may achieve high intensity radiation through strong spatial confinement of radiation propagating through the optical fiber 408, achieving high localised radiation intensities. In addition, hollow core designs (for example as compared to solid core designs) can result in higher quality transmission modes (for example, having a greater proportion of single mode transmission). The radiation intensity inside the optical fiber 408 may be high, for example due to high received input radiation intensity and/or due to strong spatial confinement of the radiation inside the optical fiber 408.

An advantage of using a hollow core optical fiber 408 may be that the majority of the radiation guided inside the optical fiber 408 is confined to the hollow core 416. Therefore, the majority of the interaction of the radiation inside the optical fiber 408 is with the gas 412, which is provided inside the hollow core 416 of the optical fiber 408. As a result, the broadening effects of the working component of the gas 412 on the radiation may be increased.

The received input radiation 402 may have any of the features of the input radiation 108 described above with reference to FIGS. 7 to 10.

The mechanism for the spectral broadening as the radiation interacts with the gas 412 may be for example one or more of four-wave mixing, modulation instability, ionisation of the working gas, Raman effects, Kerr nonlinearity, soliton formation, or soliton fission. In particular, the spectral broadening may be achieved through one or both of soliton formation, or soliton fission.

Figure 13:
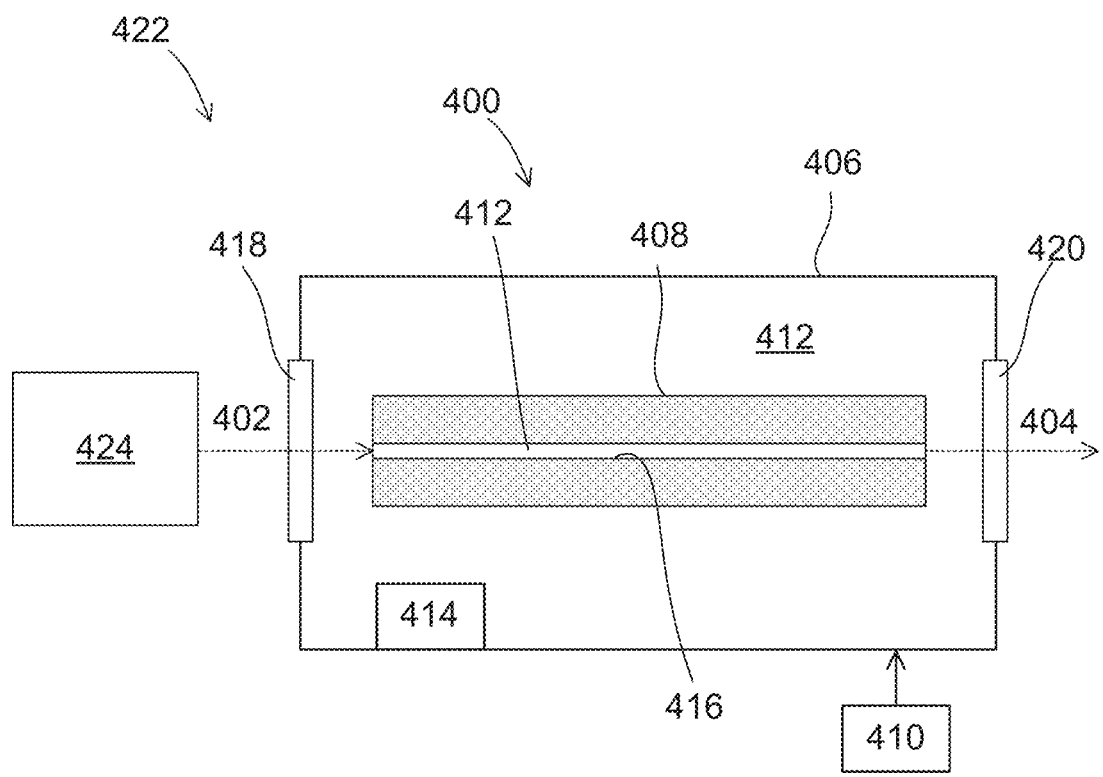
FIG. 13 depicts a schematic representation of a radiation source for providing broadband output radiation, the radiation source comprising the apparatus for broadening the frequency range of received input radiation as shown in FIG. 12.

FIG. 13 depicts a radiation source 422 for providing broadband output radiation. The radiation source 422 comprises an apparatus 400 as described above with reference to FIG. 12. The radiation source 422 further comprises an input radiation source 424 configured to provide input radiation 402 to the apparatus 400. The apparatus 400) may receive input radiation 402 from the input radiation source 424, and broaden it to provide output radiation 404.

In use, there may be contaminants such as, for example, hydrocarbons, provided in the gas chamber 406. Such contaminants may contaminate optical fiber 408 and compromise integrity of fiber 408, particularly within the hollow core 416, causing locally optical defects that may cause damage due to local heating. The radical generating apparatus 414 is configured to provide free radicals within the gas chamber 406. Advantageously, such radicals within the gas chamber 406 may react with, and may actively break down complex hydrocarbon molecules into smaller-chain hydrocarbon. Such smaller-chain hydrocarbons may be more easily removed from a surface by purging, pumping and/or diffusion.

In principle, any species of radical may be provided by the radical generating apparatus 414, in particular any species of radical which can react with complex hydrocarbon molecules and break these into smaller-chain hydrocarbons may be provided. In practice, the radicals may comprise hydrogen radicals H*. Arrangements using hydrogen radicals have a number of advantages, as now discussed. First, hydrogen radicals are relatively easy to form from molecular hydrogen ($H_2$). Second, hydrogen radicals do react with complex hydrocarbon molecules and break these into smaller-chain hydrocarbons (as opposed to forming more problematic compounds that may not be easily removed from within the gas chamber 406). Third, known apparatus for generating hydrogen radicals may be used to form the radical generating apparatus 414.

In general, the radical generating apparatus 414 may comprise a supply of molecular gas and an energy deposition mechanism. The supply of molecular gas may, for example, be provided by the gas generating apparatus 410 or from another, separate source. The energy deposition mechanism may be operable to supply energy to the supply of gas so as to cause the gas molecules to dissociate and form free radicals.

Figure 14:
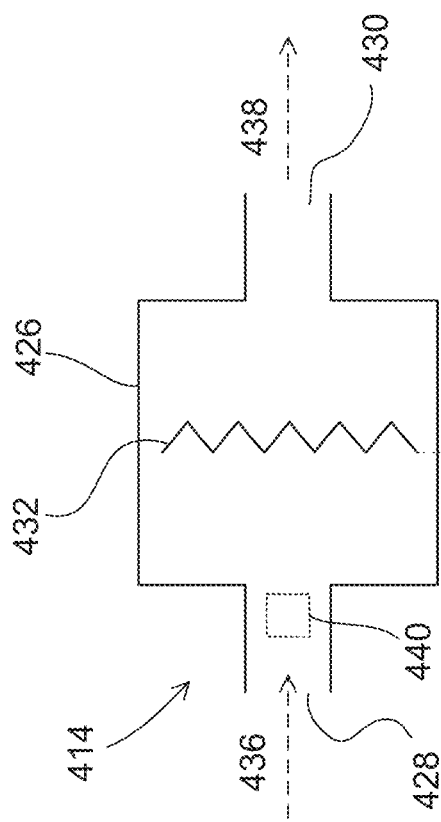
FIG. 14 shows an embodiment of an example radical generating apparatus which may form part of the apparatus for broadening the frequency range of received input radiation as shown in FIG. 12.

An embodiment of an example radical generating apparatus 414 is now described with reference to FIG. 14.

The radical generating apparatus 414 comprises a housing 426 having an inlet 428 and an outlet 430. The radical generating apparatus 414 comprises an element 432 disposed within the housing 426. The element 432 is maintained at a high temperature, for example, using a power supply 434. For example, the element 432 may be maintained at a temperature of the order of 1500° C. In order to withstand this, the element 432 may be formed from a suitable metal such as, for example, molybdenum or tungsten.

In use, an inlet gas 436 flows into the inlet 428; flows past or over the element 432; and flows out of the outlet 430 as an outlet gas 438. Optionally, the radical generating apparatus 414 may be provided with a pump 440 (shown rather schematically in FIG. 14) to encourage this flow from the inlet 428 to the outlet 430.

As the inlet gas (which may, for example, comprise molecular hydrogen) flows past the element 432, gas molecules impinge on the element 432 and receive energy therefrom. As a result of receiving this energy the gas molecules dissociate and form free radicals. The element 432 may be referred to as an energy deposition mechanism. As a result, the outlet gas 438 contains radicals (for example hydrogen radicals H*). When the radical generating apparatus 414 is provided with a flow of hydrogen gas 436 at the inlet 428, it may be referred to as a hydrogen radical generator (HRG).

Although in this example embodiment, heated element 432 provides an energy deposition mechanism, it will be appreciated that in alternative embodiments other energy deposition mechanisms may be used. Example energy deposition mechanisms include: laser beams and a pairs of electrodes with a voltage maintained across them.

Figure 15B:
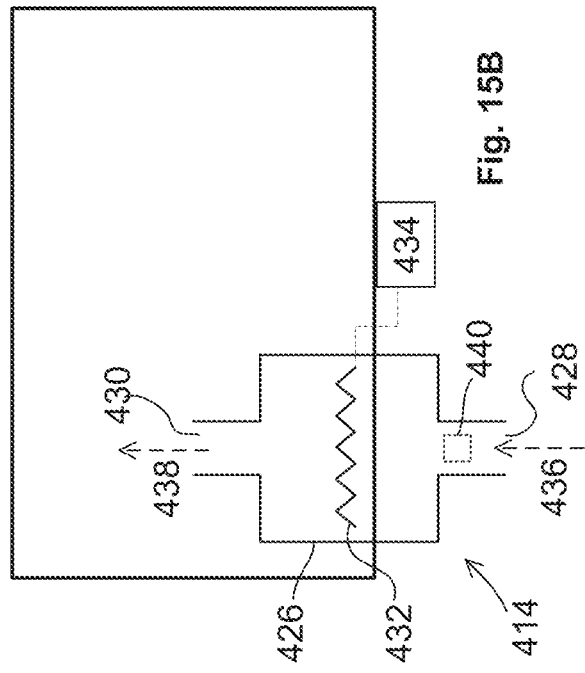
FIG. 15B shows a second arrangement for combining a gas chamber of the apparatus for broadening the frequency range of received input radiation as shown in FIG. 12 with the example radical generating apparatus shown in FIG. 14.
Figure 15A:
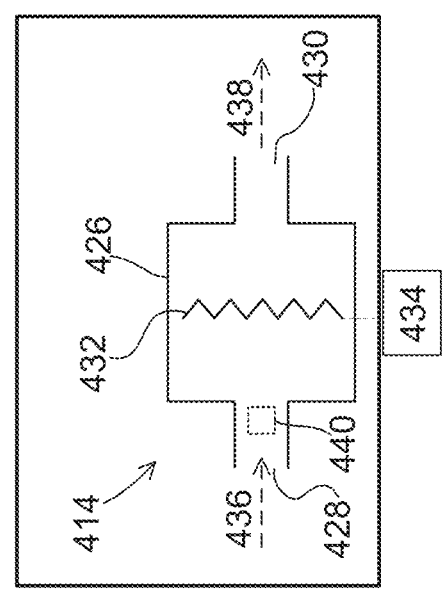
FIG. 15A shows a first arrangement for combining a gas chamber of the apparatus for broadening the frequency range of received input radiation as shown in FIG. 12 with the example radical generating apparatus shown in FIG. 14.

Such a radical generating apparatus 414 may be provided to the gas chamber 406 in a number of different ways. For example, as shown schematically in FIG. 15A, the radical generating apparatus 414 may be disposed within the gas chamber 406 such that both the inlet 428 and the outlet 430 are in fluid communication with an interior of the gas chamber 406. It will be understood that for ease of understanding, in FIGS. 15A and 15B only the gas chamber 406 and the radical generating apparatus 414 are shown and, for example, other features shown in FIGS. 12 and 13 have been omitted. With such an arrangement, gas within the gas chamber (for example as provided by the gas generating apparatus 410) may pass through radical generating apparatus 414, producing radicals back into the interior of the gas chamber 406. Alternatively, as shown schematically in FIG. 15B, the radical generating apparatus 414 may be disposed within a wall of the gas chamber 406. With such an arrangement, the inlet 428 is in fluid communication with a gas source (not shown) external to the gas chamber 406 and the outlet 430 is in fluid communication with an interior of the gas chamber 406. With such an arrangement, radicals may be generated as a gas is introduce into the gas chamber. As another alternative, the radical generating apparatus 414 may be disposed outside of the gas chamber 406 but such that the outlet 430 is in fluid communication with an interior of the gas chamber 406.

Advantageously, it is expected that the provision of such a radical generating apparatus 414 this will greatly reduce contaminants inside the gas chamber 406. In some embodiments an interior of the gas chamber 406 may be flushed (either continuously or intermittently) to remove smaller chain hydrocarbons formed after reaction with the radicals. Alternatively, a surface inside the gas chamber 406 may be provided that actively attracts such gas-borne hydrogen-bonded contaminants.

The radiation sources 200, 422 described above may be provided as part of a metrology arrangement for determining a parameter of interest of a structure on a substrate. The structure on the substrate may for example be a lithographic pattern applied to the substrate. The metrology arrangement may further comprise an illumination sub-system for illuminating the structure on the substrate. The metrology arrangement may further comprise a detection sub-system for detecting a portion of radiation scattered and/or reflected by the structure. The detection sub-system may further determine the parameter of interest on the structure from the portion of radiation scattered and/or reflected by the structure. The parameter may for example be overlay, alignment, or levelling data of the structure on the substrate.

The metrology arrangement described above may form part of a metrology apparatus MT. The metrology arrangement described above may form part of an inspection apparatus. The metrology arrangement described above may be included inside a lithographic apparatus LA.

Further embodiments are disclosed in the subsequent numbered clauses:

1. An apparatus for receiving input radiation and broadening a frequency range of the input radiation so as to provide broadband output radiation, the apparatus comprising:
    a fiber, the fiber comprising a hollow core for guiding radiation propagating through the fiber; and
    an apparatus for providing a gas mixture within the hollow core;
    wherein the gas mixture comprises:
        a hydrogen component; and
        a working component for broadening a frequency range of a received input radiation so as to provide the broadband output radiation.

2. An apparatus according to clause 1, wherein the broadband output radiation comprises a continuous range of radiation frequencies.

3. An apparatus according to any of the preceding clauses, wherein the hydrogen component comprises at least one of hydrogen gas, deuterium gas, and tritium gas.

4. An apparatus according to any of the preceding clauses, wherein the hydrogen component comprises hydrogen radicals.

5. An apparatus according to any of the preceding clauses wherein the working component comprises a noble gas.

6. An apparatus according to any of the preceding clauses, wherein the fraction of the hydrogen component in the gas is less than 70%.

7. An apparatus according to clause 6, wherein the fraction of the hydrogen component in the gas is less than 50%.

8. An apparatus according to clause 7, wherein the fraction of the hydrogen component in the gas mixture is less than 10%.

9. An apparatus according clause 8, wherein the fraction of the hydrogen component in the gas mixture is less than 2%.

10. An apparatus according to any of the preceding clauses wherein the fiber is a photonic crystal fiber.

11. An apparatus according to any of the preceding clauses, wherein the fiber comprises a ring structure surrounding the hollow core.

12. An apparatus according to clause 11, wherein the ring structure comprises a plurality of structures arranged around a central portion of the ring structure.

13. An apparatus according to clause 12, wherein the plurality of structures comprises one or more anti-resonant elements.

14. An apparatus according to any of clauses 12 or 13 wherein the plurality of structures comprises a plurality of capillaries.

15. An apparatus according to any of clauses 13 to 14, wherein the plurality of structures is arranged so that the structures do not touch any of the other structures.

16. An apparatus according to any of clauses 12 to 15, wherein the fiber comprises a plurality of ring structures, wherein at least one of the plurality of ring structures surrounds the hollow core.

17. An apparatus according to clause 16, wherein at least one of the ring structures comprises a plurality of structures arranged around a central portion of the ring structure.

18. An apparatus according to any of clauses 12 to 16, wherein the hydrogen component of the gas mixture increases the lifetime of the plurality of structures.

19. An apparatus according to clause 18 wherein the degradation of the performance after 1000 hours of operation does not exceed 2%.

20. An apparatus according to any preceding clause further comprising a radical generating apparatus for forming radicals from the gas mixture.

21. An apparatus for receiving input radiation and broadening a frequency range of the input radiation so as to provide broadband output radiation, the apparatus comprising:
    a chamber;
    a fiber, the fiber comprising a hollow core for guiding radiation propagating through the fiber, the hollow core of the fiber being in fluid communication with the chamber;
    a gas generating apparatus for providing a gas within the chamber; and
    a radical generating apparatus for providing radicals within the chamber.

22. The apparatus of clause 21 wherein the radical generating apparatus comprises: a supply of molecular gas; and an energy deposition mechanism operable to supply energy to the supply of gas so as to cause the gas molecules to dissociate and form free radicals.

23. A radiation source for providing broadband output radiation, the radiation source comprising:
    the apparatus according to any of the preceding clauses; and
    an input radiation source configured to provide input radiation to the apparatus;
    wherein the apparatus is configured to broaden the input radiation to provide the broadband output radiation.

24. A radiation source according to clause 23, wherein the input radiation is pulsed.

25. A radiation source according to any of clauses 23 or 24, wherein the broadband output radiation has an average power of at least 1 W.

26. A radiation source according clause 25, wherein the broadband output radiation has an average power of at least 5 W.

27. A radiation source according to clause 26, wherein the broadband output radiation has an average power of at least 10 W.

28. A radiation source according to any of clauses 23 to 27 wherein a fraction of a hydrogen component in the gas mixture of the apparatus is sufficiently high so that the fiber has an average output power stability of at least 95% for more than 100 hours of operation.

29. A method of broadening a radiation frequency range, the method comprising:
providing an apparatus according to any of clauses 1-22;
propagating input radiation through the hollow core fiber, wherein the interaction of the input radiation with the gas inside the hollow core fiber causes broadening of the frequency range of the input radiation so as to produce broadband output radiation.

30. A metrology arrangement for determining a parameter of interest of a structure on a substrate, the metrology arrangement comprising:
a radiation source according to any of clauses 23-28;
an illumination sub-system for illuminating the structure on the substrate using the broadband output radiation; and
a detection sub-system for detecting a portion of radiation scattered and/or reflected by the structure, and for determining the parameter of interest from said portion of radiation.

31. A metrology apparatus comprising the metrology arrangement according to clause 30.

32. An inspection apparatus comprising the metrology arrangement according to clause 30.

33. A lithographic apparatus comprising the metrology arrangement according to clause 30.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:
1. An apparatus for receiving input radiation and broadening a frequency range of the input radiation so as to provide broadband output radiation, the apparatus comprising:
a fiber, the fiber comprising a hollow core configured to guide radiation propagating through the fiber; and
a generating apparatus configured to provide a gas mixture within the hollow core,
wherein the gas mixture comprises:
a hydrogen component; and
a working component configured to broaden a frequency range of a received input radiation so as to provide the broadband output radiation,
wherein the fraction of the hydrogen component in the gas mixture is less than 70% thereby decreasing a degradation of the fiber and increasing a lifetime of the fiber,
wherein the fraction of the working component in the gas mixture predominantly broadens the frequency range of the received input radiation, and
wherein a degradation of an output power performance of the apparatus after 1000 hours of operation does not exceed 20%.

2. The apparatus of claim 1, wherein the broadband output radiation comprises a continuous range of radiation frequencies.

3. The apparatus of claim 1, wherein the hydrogen component comprises at least one of hydrogen gas, deuterium gas, and tritium gas.

4. The apparatus of claim 1, wherein the working component comprises a noble gas.

5. The apparatus of claim 1, wherein the fraction of the hydrogen component in the gas mixture is less than 50%, or optionally less than 10%, or optionally less than 2%.

6. The apparatus of claim 1, wherein the fiber is a photonic crystal fiber.

7. The apparatus of claim 1, wherein:
the fiber comprises a ring structure surrounding the hollow core,
the ring structure comprises a plurality of structures arranged around a central portion of the ring structure,
the plurality of structures comprises one or more anti-resonant elements,
the plurality of structures comprises a plurality of capillaries, and
the plurality of structures is arranged so that the plurality of structures do not touch any of the other structures.

8. The apparatus of claim 1, wherein the degradation of the output power performance of the apparatus after 1000 hours of operation does not exceed 2%.

9. A radiation source for providing broadband output radiation, the radiation source comprising:
the apparatus of claim 1; and an input radiation source configured to provide input radiation to the apparatus, wherein the apparatus is configured to broaden the input radiation to provide the broadband output radiation.

10. The radiation source of claim 9, wherein the broadband output radiation has an average power of at least 1 W, or at least 5 W, or at least 10 W.

11. The radiation source of claim 9, wherein the fraction of the hydrogen component in the gas mixture of the apparatus is sufficiently high so that the fiber has an average output power stability of at least 95% for more than 100 hours of operation.

12. A metrology arrangement for determining a parameter of interest of a structure on a substrate, the metrology arrangement comprising:

the radiation source of claim 9;

an illumination sub-system configured to illuminate the structure on the substrate using the broadband output radiation; and a detection sub-system configured to detect a portion of radiation scattered and/or reflected by the structure and determine the parameter of interest from the portion of radiation.

13. A metrology apparatus comprising:

the metrology arrangement of claim 12; and a processor configured to determine a property of the substrate based on data from the metrology arrangement.

14. A lithographic apparatus comprising the metrology arrangement of claim 12.

15. A method of broadening a radiation frequency range, the method comprising:

providing the apparatus of claim 1; and propagating input radiation through the hollow core fiber, wherein the interaction of the input radiation with the gas mixture inside the hollow core fiber causes broadening of the frequency range of the input radiation so as to produce broadband output radiation.

16. The apparatus of claim 1, wherein the input radiation comprises high intensity pulsed input radiation having a pulse energy of at least 5 µJ.

17. The apparatus of claim 16, wherein the pulse energy is at least 25 µJ.

18. The apparatus of claim 1, wherein the input radiation comprises high intensity pulsed input radiation having a pulse duration of no greater than 10 ps.

19. The apparatus of claim 18, wherein the pulse duration is no greater than 300 fs.

20. The apparatus of claim 1, wherein the input radiation comprises high intensity input radiation having an average power of at least 1 W, or at least 5 W, or at least 10 W, or at least 20 W, or at least 50 W, or at least 100 W.

* * * * *